United States Patent
Ella

(10) Patent No.: US 10,826,543 B2
(45) Date of Patent: Nov. 3, 2020

(54) FILTER CIRCUIT CONFIGURATION FOR CARRIER AGGREGATION

(71) Applicant: Qualcomm Incorporated, San Diego, CA (US)

(72) Inventor: Juha Sakari Ella, Halikko (FI)

(73) Assignee: QUALCOMM Incorporated, San Diego, CA (US)

( * ) Notice: Subject to any disclaimer, the term of this patent is extended or adjusted under 35 U.S.C. 154(b) by 277 days.

(21) Appl. No.: 16/048,035

(22) Filed: Jul. 27, 2018

(65) Prior Publication Data

US 2020/0036401 A1   Jan. 30, 2020

(51) Int. Cl.
*H04B 1/00* (2006.01)
*H04L 5/14* (2006.01)
*H03H 9/145* (2006.01)

(52) U.S. Cl.
CPC .......... *H04B 1/0064* (2013.01); *H04B 1/006* (2013.01); *H04B 1/0057* (2013.01); *H04L 5/14* (2013.01); *H03H 9/14502* (2013.01)

(58) Field of Classification Search
CPC .... H03H 9/14502; H03H 9/542; H03H 9/568; H04B 1/0057; H04B 1/006; H04B 1/0064; H04B 1/1036; H04B 1/525; H04L 5/001; H04L 5/14; H04L 27/26; H04W 16/26

See application file for complete search history.

(56) References Cited

U.S. PATENT DOCUMENTS

| | | | |
|---|---|---|---|
| 9,496,913 B2 | 11/2016 | King et al. | |
| 9,660,687 B2 | 5/2017 | Ella et al. | |
| 9,699,784 B2 | 7/2017 | Luong et al. | |
| 9,748,992 B2 | 8/2017 | Pehlke | |
| 2008/0101417 A1* | 5/2008 | Chapman | H04B 1/1027 370/497 |
| 2012/0302188 A1* | 11/2012 | Sahota | H04B 1/1036 455/150.1 |
| 2014/0321353 A1* | 10/2014 | Zhan | H04W 16/26 370/315 |
| 2016/0380681 A1 | 12/2016 | Sahota | |
| 2017/0201369 A1 | 7/2017 | Ellä et al. | |

\* cited by examiner

*Primary Examiner* — Khoa Huynh
(74) *Attorney, Agent, or Firm* — Qualcomm Incorporated

(57) ABSTRACT

The present disclosure provides an apparatus that includes a plurality of filter circuits configured to filter one or more signals. The plurality of filter circuits includes a first filter component configured to have a first passband that spans adjacent transmission frequency ranges of a first communication band and a second communication band. The plurality of filter circuits further includes a second filter component having a second passband that spans a reception frequency range of a third communication band. The plurality of filter circuits further includes a third filter component having a third passband that spans adjacent reception frequency ranges of the first communication band and the third communication band. The plurality of filter circuits further includes a fourth filter component having a fourth passband that spans the second reception frequency range of the second communication band.

27 Claims, 14 Drawing Sheets

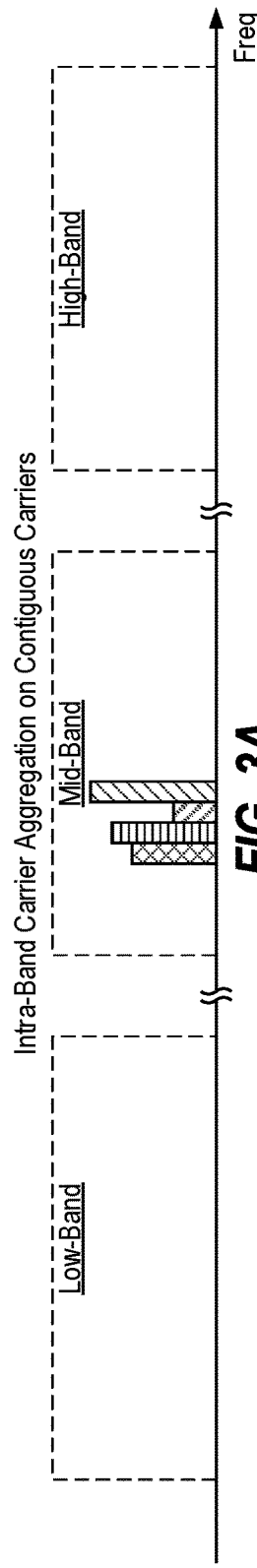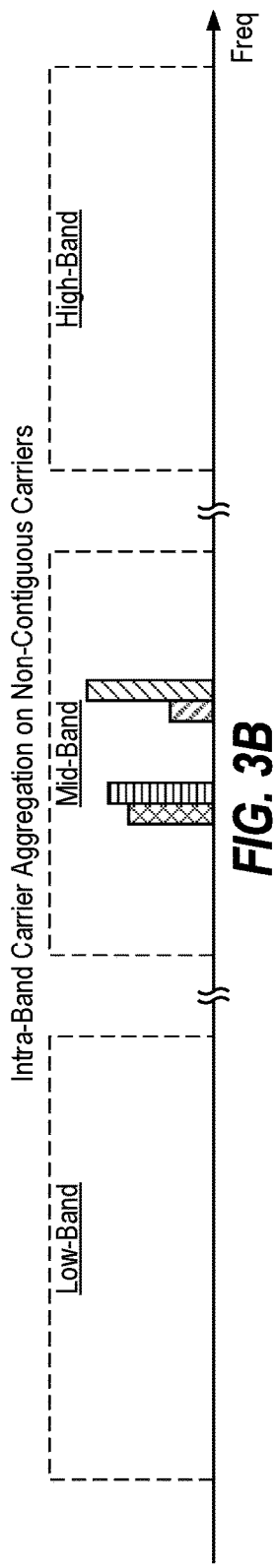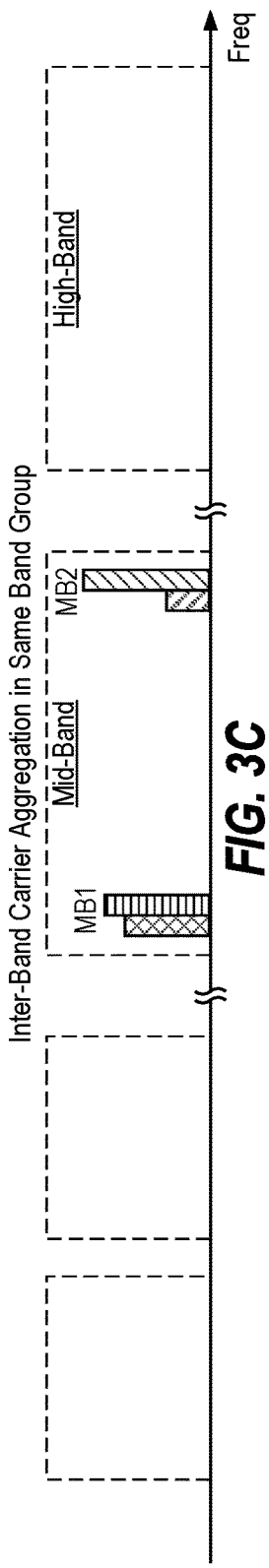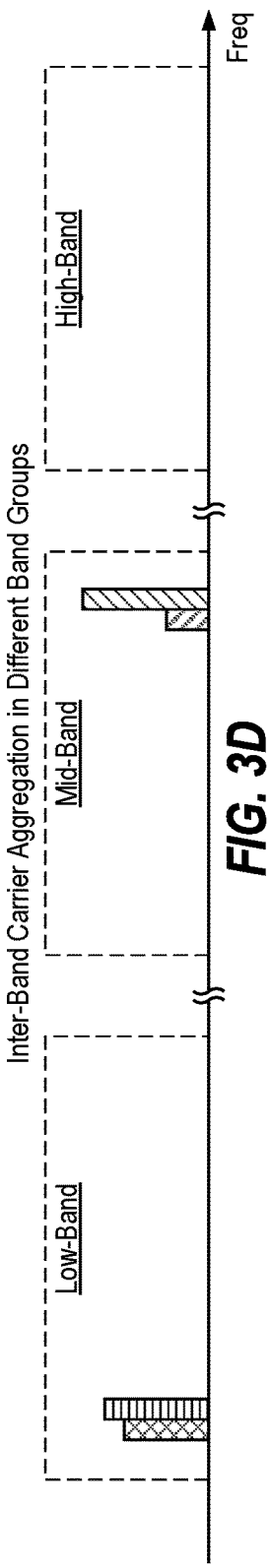

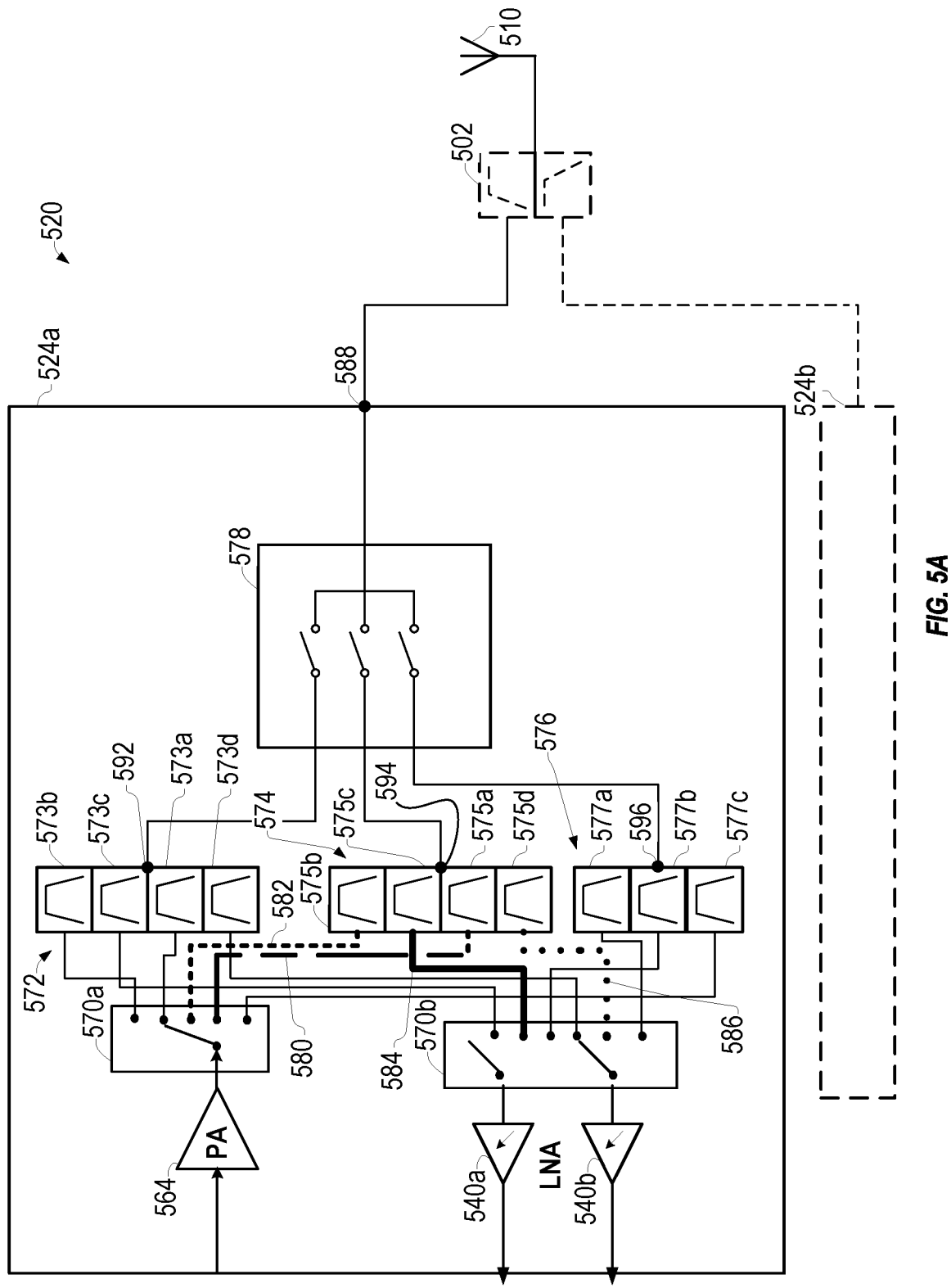

US 10,826,543 B2

FILTER CIRCUIT CONFIGURATION FOR CARRIER AGGREGATION

FIELD

The present disclosure relates generally to wireless communications and more particularly to filter configurations for use with carrier aggregation.

BACKGROUND

A wireless device (e.g., a cellular phone or a smartphone) in a wireless communication system may transmit and receive data for two-way communication. The wireless device may include a transmitter for data transmission and a receiver for data reception. For data transmission, the transmitter may modulate a radio frequency (RF) carrier signal with data to obtain a modulated RF signal, amplify the modulated RF signal to obtain an amplified RF signal having the proper output power level, and transmit the amplified RF signal via an antenna to a base station. For data reception, the receiver may obtain a received RF signal via the antenna and may amplify and process the received RF signal to recover data sent by the base station.

A wireless device may support carrier aggregation, which is simultaneous operation on multiple carriers. A carrier may refer to a range of frequencies used for communication and may be associated with certain characteristics. For example, a carrier may be associated with system information describing operation on the carrier. A carrier may also be referred to as a component carrier (CC), a frequency channel, a cell, etc. It is desirable to efficiently support carrier aggregation by the wireless device.

SUMMARY

In one aspect of the disclosure, an apparatus for filtering one or more signals for wireless communications is provided. The apparatus includes a plurality of filter circuits configured to filter the one or more signals transmitted and received over at least one of a first predefined communication band defined by a first transmission frequency range and a first reception frequency range, a second predefined communication band defined by a second transmission frequency range and a second reception frequency range, and a third predefined communication band defined by a third transmission frequency range and a third reception frequency range. The plurality of filter circuits includes a first filter component configured to have a first passband that spans both the first transmission frequency range and the second transmission frequency range, the first transmission frequency range substantially adjacent to the second transmission frequency range. The plurality of filter circuits further includes a second filter component having a second passband that spans the third transmission frequency range. The plurality of filter circuits further includes a third filter component having a third passband that spans both the first reception frequency range and the third reception frequency range, the third reception frequency range substantially adjacent to the first reception frequency range. The plurality of filter circuits further includes a fourth filter component having a fourth passband that spans the second reception frequency range.

In another aspect of the disclosure a method for filtering one or more signals for wireless communications is provided. The method includes filtering, via a quadplexer, the one or more signals transmitted and received over at least one of a first predefined communication band defined by a first transmission frequency range and a first reception frequency range, a second predefined communication band defined by a second transmission frequency range and a second reception frequency range, and a third predefined communication band defined by a third transmission frequency range and a third reception frequency range. The filtering includes filtering the one or more signals using a first filter component of the quadplexer, the first filter component having a first passband that spans both the first transmission frequency range and the second transmission frequency range, the first transmission frequency range substantially adjacent to the second transmission frequency range. The filtering further includes filtering the one or more signals using a second filter component of the quadplexer, the second filter component having a second passband that spans the third transmission frequency range. The filtering further includes filtering the one or more signals using a third filter component of the quadplexer, the third filter component having a third passband that spans both the first reception frequency range and the third reception frequency range, the third reception frequency range substantially adjacent to the first reception frequency range. The filtering further includes filtering the one or more signals using a fourth filter component of the quadplexer, the fourth filter component having a fourth passband that spans the second reception frequency range.

In yet another aspect of the disclosure an apparatus for filtering one or more signals for wireless communications is provided. The apparatus includes means for filtering the one or more signals transmitted and received over at least one of a first predefined communication band defined by a first transmission frequency range and a first reception frequency range, a second predefined communication band defined by a second transmission frequency range and a second reception frequency range, and a third predefined communication band defined by a third transmission frequency range and a third reception frequency range. The means for filtering includes a first means for filtering having a first pas sband that spans both the first transmission frequency range and the second transmission frequency range, the first transmission frequency range substantially adjacent to the second transmission frequency range. The means for filtering further includes a second means for filtering having a second passband that spans the third transmission frequency range. The means for filtering further includes a third means for filtering having a third passband that spans both the first reception frequency range and the third reception frequency range, the third reception frequency range substantially adjacent to the first reception frequency range. The means for filtering further includes a fourth means for filtering having a fourth passband that spans the second reception frequency range.

BRIEF DESCRIPTION OF THE DRAWINGS

FIGS. 3A, 3B, 3C, and 3D are diagrams illustrating four examples of carrier aggregation types according to aspects of the present disclosure.

FIGS. 5A and 5B are schematic diagrams of an example of a portion of a front-end circuit of a transceiver circuit of the wireless device of FIG. 2.

DETAILED DESCRIPTION

Figure 1:
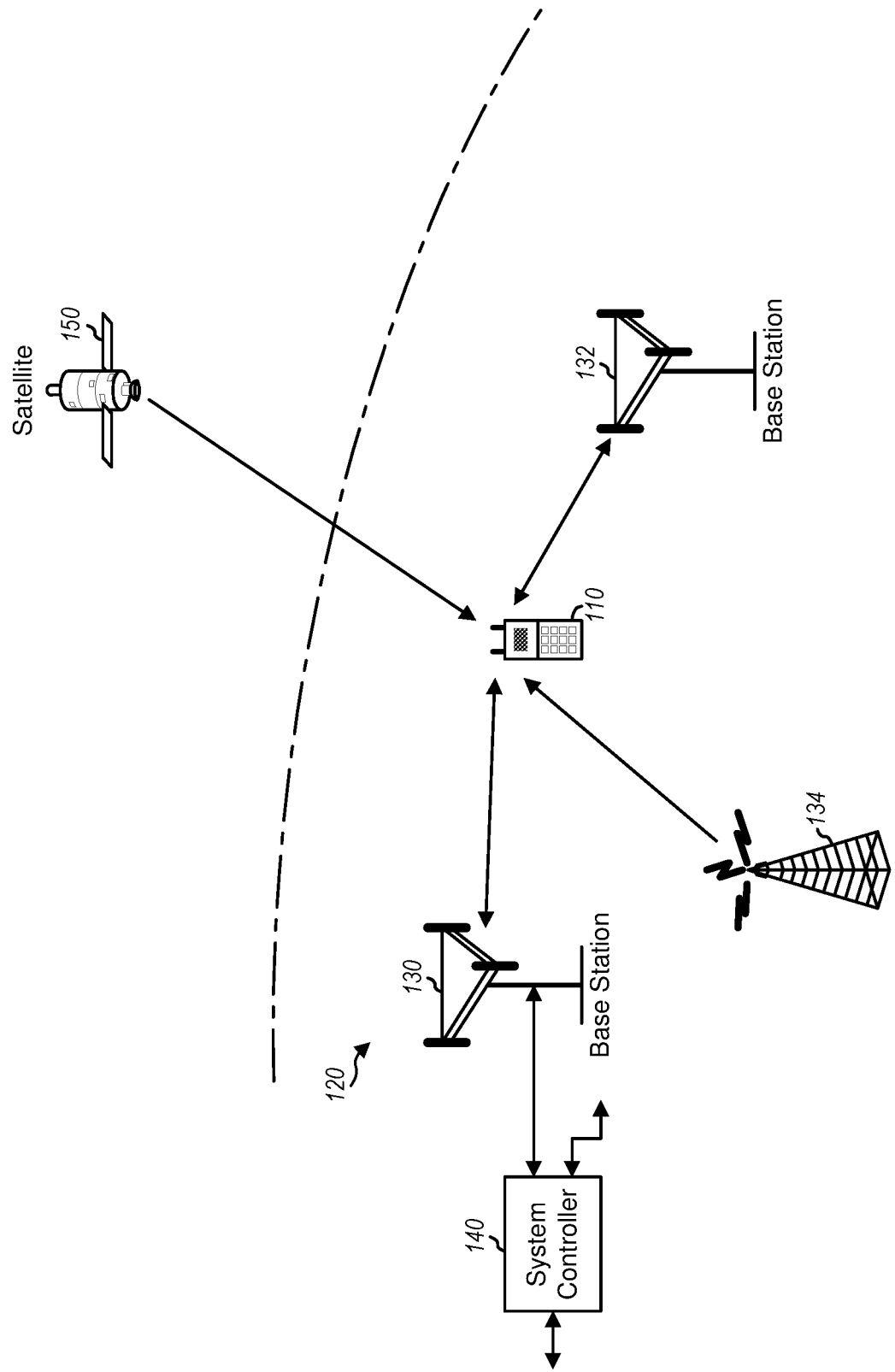
FIG. 1 is a diagram of wireless device communication in a wireless system according to an aspect of the present disclosure.

The detailed description set forth below in connection with the appended drawings is intended as a description of exemplary implementations and is not intended to represent the only implementations in which the invention may be practiced. The term "exemplary" used throughout this description means "serving as an example, instance, or illustration," and should not necessarily be construed as preferred or advantageous over other exemplary implementations. The detailed description includes specific details for the purpose of providing a thorough understanding of the exemplary implementations. In some instances, some devices are shown in block diagram form. Drawing elements that are common among the following figures may be identified using the same reference numerals.

As noted, a wireless device may support carrier aggregation, which is simultaneous operation on multiple carriers Filtering requirements when implementing carrier aggregation increase as the number of combinations of bands a device is required to support simultaneously increases. Particularly, when multiple bands are being used amongst different modes (e.g., different pairs of bands) the matching and loading of different connected filter outputs has to be managed carefully. For interband carrier aggregation, if the bands are close to each other in frequency the complexity of the filtering requirements increases.

Aspects of the disclosure are related to a filter circuit configuration that allows for supporting 3 different bands along with 2 different carrier aggregation pairs amongst the three bands while simplifying the filter configuration structure. Particularly, aspects of the present disclosure provide for a single quadplexer filter configuration that supports three different bands in single mode along with also supporting two different carrier aggregation pairs amongst the three bands. In an aspect, the quadplexer provides at least two filters with passbands that span multiple bands for bands that have adjacent ranges in portions of the transmission and reception defined frequency ranges. The filter implementations described herein may reduce overall device component cost, avoid duplicate filtering, reduce calibration requirements for transmit paths, among other aspects.

FIG. 1 shows a wireless device 110 communicating with a wireless communication system 120. The wireless system 120 may be a long term evolution (LTE) system, a 5th generation wireless system (5G), a code division multiple access (CDMA) system, a global system for mobile communications (GSM) system, a wireless local area network (WLAN) system, or some other wireless system, or combination thereof. A CDMA system may implement wideband CDMA (WCDMA), time division synchronous CDMA (TD-SCDMA), CDMA2000, or some other version of CDMA. For simplicity, FIG. 1 shows the wireless system 120 including two base stations 130 and 132 and one system controller 140. In general, a wireless system may include any number of base stations and any number of network entities.

The wireless device 110 may also be referred to as a user equipment (UE), a mobile station, a terminal, an access terminal, a subscriber unit, a station, etc. The wireless device 110 may be a cellular phone, a smartphone, a tablet, a wireless modem, a personal digital assistant (PDA), a hand-held device, a laptop computer, a smartbook, a netbook, a cordless phone, a wireless local loop (WLL) station, a Bluetooth device, and the like. The wireless device 110 may be capable of communicating with the wireless system 120. The wireless device 110 may also be capable of receiving signals from broadcast stations (e.g., a broadcast station 134), signals from satellites (e.g., a satellite 150) in one or more global navigation satellite systems (GNSS), etc. The wireless device 110 may support one or more radio technologies for wireless communication such as LTE, CDMA2000, WCDMA, TD-SCDMA, GSM, 802.11, etc.

The wireless device 110 may support carrier aggregation, which is operation on multiple carriers. Carrier aggregation may also be referred to as multi-carrier operation. According to an aspect of the present disclosure, the wireless device 110 may be able to operate in low-band from 698 to 960 megahertz (MHz), mid-band from 1475 to 2170 MHz, and/or high-band from 2300 to 2690, ultra-high band from 3400 to 3800 MHz, and long-term evolution (LTE) in LTE unlicensed bands (LTE-U/LAA) from 5150 MHz to 5950 MHz. Low-band, mid-band, high-band, ultra-high band, and LTE-U refer to five groups of bands (or band groups—e.g., within a certain frequency range), with each band group including a number of frequency bands (or simply, "bands"). For example, in some systems each band may cover up to 200 MHz and may include one or more carriers. For example, each carrier may cover up to 40 MHz in LTE. Of course, the range for each of the bands is merely exemplary and not limiting, and other frequency ranges may be used. Examples of LTE/UMTS bands are listed in 3GPP TS 36.101. The wireless device 110 may be configured with multiple carriers in several bands (e.g., see LTE Release 15).

In general, carrier aggregation (CA) may be categorized into two types: intra-band CA and inter-band CA. Intra-band CA refers to operation on multiple carriers within the same band and inter-band CA refers to operation on multiple carriers in different bands.

Figure 2:
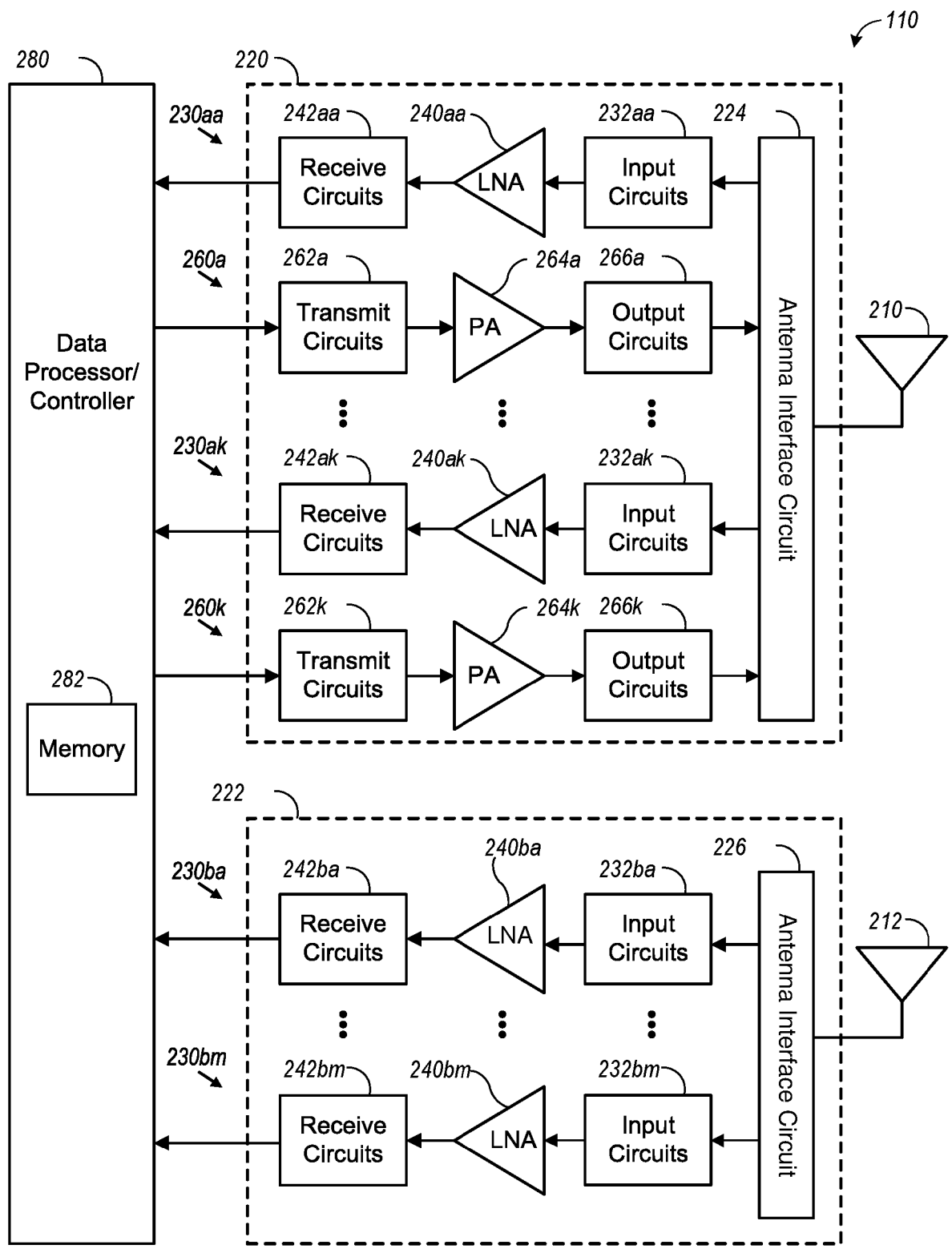
FIG. 2 is a functional block diagram of the wireless device of FIG. 1 according to an aspect of the present disclosure.

FIG. 2 is a functional block diagram of the wireless device 110 of FIG. 1 according to an aspect of the present disclosure. In this exemplary design, the wireless device 110 includes a transceiver 220 coupled to a primary antenna 210, receivers 222 coupled to a secondary antenna 212, and a data processor/controller 280. The transceiver 220 includes multiple (K) receivers 230aa to 230ak and multiple (K) transmitters 260a to 260k to support multiple bands, carrier aggregation, multiple radio technologies, etc. The receivers 222 include multiple (M) receivers 230ba to 230bm to support multiple bands, carrier aggregation, multiple radio technologies, receive diversity, MIMO transmission from multiple transmit antennas to multiple receive antennas, etc.

In the exemplary design shown in FIG. 2, each receiver 230 includes input circuits 232, a low-noise amplifier (LNA) 240, and receive circuits 242. For data reception, the antenna 210 receives signals from base stations and/or other transmitter stations and provides a received RF signal, which is routed through an antenna interface circuit 224 and provided to a selected receiver. The antenna interface circuit 224 may include switches, duplexers, transmit filters, receive filters, etc. The description below assumes that the receiver 230aa is the selected receiver. Within the receiver 230aa, the received RF signal is passed through input circuits 232aa, which provides an input RF signal to an LNA 240aa. Input circuits 232aa may include a matching circuit, a receive filter, etc. The LNA 240aa amplifies the input RF signal and provides an output RF signal. Receive circuits 242aa amplify, filter, and down convert the output RF signal from RF to baseband and provide an analog input signal to data processor 280. Receive circuits 232 may include mixers, filters, amplifiers, matching circuits, an oscillator, a local oscillator (LO) generator, a phase locked loop (PLL), etc. Each remaining receiver 230 in the transceiver 220 and each receiver 230 in the receivers 222 may operate in a similar manner as the receiver 230aa in the transceiver 220.

In the exemplary design shown in FIG. 2, each transmitter 260 includes transmit circuits 262, a power amplifier (PA) 264, and output circuits 266. For data transmission, a data processor 280 processes (e.g., encodes and modulates) data to be transmitted and provides an analog output signal to a selected transmitter. The description below assumes that the transmitter 260a is the selected transmitter. Within the transmitter 260a, transmit circuits 262a amplify, filter, and upconvert the analog output signal from baseband to RF and provide a modulated RF signal. Transmit circuits 262a may include amplifiers, filters, mixers, matching circuits, an oscillator, an LO generator, a PLL, etc. A PA 264a receives and amplifies the modulated RF signal and provides a transmit RF signal having the proper output power level. The transmit RF signal is passed through output circuits 266a, routed through the antenna interface circuit 224, and transmitted via the antenna 210. Output circuits 266a may include a matching circuit, a transmit filter, a directional coupler, etc.

FIG. 2 shows an exemplary design of receivers 230 and transmitters 260. A receiver and a transmitter may also include other circuits not shown in FIG. 2, such as filters, matching circuits, etc. All or a portion of the transceiver 220 and receivers 222 may be implemented on one or more analog integrated circuits (ICs), RF ICs (RFICs), mixed-signal ICs, etc. For example, LNAs 240, receive circuits 242, and transmit circuits 262 may be implemented on one module, which may be an RFIC, etc. Antenna interface circuits 224 and 226, input circuits 232, output circuits 266, and PAs 264 may be implemented on another module, which may be a hybrid module, etc. The circuits in the transceiver 220 and receivers 222 may also be implemented in other manners.

The data processor/controller 280 may perform various functions for the wireless device 110. For example, the data processor 280 may perform processing for data received via the receivers 230 and data transmitted via the transmitters 260. The controller 280 may control the operation of antenna interface circuits 224 and 226, input circuits 232, LNAs 240, receive circuits 242, transmit circuits 262, PAs 264, output circuits 266, or a combination thereof. A memory 282 may store program codes and data for the data processor/controller 280. The data processor/controller 280 may be implemented on one or more application specific integrated circuits (ASICs) and/or other ICs.

The wireless device 110 may receive transmissions from one or more base stations/cells on multiple carriers at different frequencies for carrier aggregation. For intra-band CA, the transmissions are sent on different carriers in the same band. For inter-band CA, the transmissions are sent on multiple carriers in different bands.

FIG. 3A shows an example of contiguous intra-band CA. In the example shown in FIG.

3A, a wireless device (e.g., the wireless device 110) is configured with four contiguous carriers in the same frequency range, which is a band in mid-band frequency range. The wireless device may send and/or receive transmissions on multiple contiguous carriers within the same defined frequency range.

FIG. 3B shows an example of non-contiguous intra-band CA. In the example shown in FIG. 3B, a wireless device (e.g., the wireless device 110) is configured with four non-contiguous carriers in the same frequency range, which is a band in the mid-band frequency range. The carriers may be separated by 5 MHz, 10 MHz, or some other amount. The wireless device may send and/or receive transmissions on multiple non-contiguous carriers within the same frequency range (e.g., mid-band).

FIG. 3C shows an example of inter-band CA in the same frequency range. In the example shown in FIG. 3C, a wireless device (e.g., the wireless device 110) is configured with four carriers in two bands in the same frequency range, which is the mid-band frequency range. The wireless device may send and/or receive transmissions on multiple carriers in different bands in the same frequency range (e.g., Mid-Band 1 (MB1) and Mid-Band 2 (MB2) in FIG. 3C).

FIG. 3D shows an example of inter-band CA in different frequency ranges. In the example shown in FIG. 3D, a wireless device (e.g., the wireless device 110) is configured with four carriers in two bands in different frequency ranges, which include two carriers in one band in the low-band frequency range and two additional carriers in another band in the mid-band frequency range. The wireless device may send and/or receive transmissions on multiple carriers in different bands in different frequency ranges (e.g., low-band frequency ranges and mid-band frequency ranges in FIG. 3D). FIGS. 3A to 3D show four examples of carrier aggregation. Carrier aggregation may also be supported for other combinations of bands. For example, carrier aggregation may be supported for low-band and high-band, mid-band and high-band, high-band and high-band, and other combinations with ultra-high band frequency ranges and long-term evolution in unlicensed spectrum (LTE-U).

Figure 4:
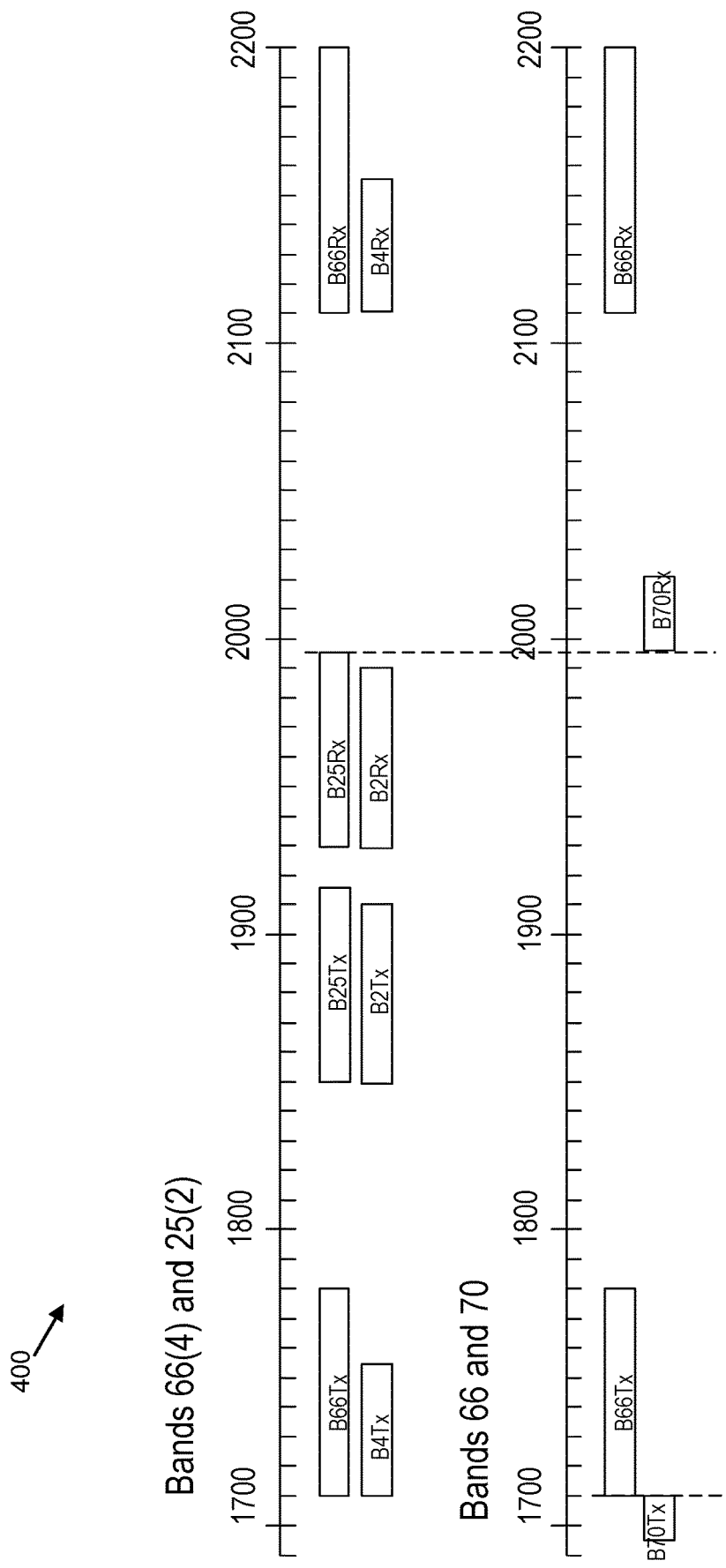
FIG. 4 is a diagram illustrating band combinations for a carrier aggregation scenario according to aspects of the present disclosure.

FIG. 4 is a diagram 400 illustrating band combinations for a carrier aggregation scenario according to aspects of the present disclosure. The diagram 400 illustrates inter-band carrier aggregation scenarios where two frequency division duplex (FDD) bands are used simultaneously for reception or transmission or both to increase data rates. The diagram 400 illustrates a carrier aggregation scenario using, as an example, three bands where at least two different combinations of the three bands are used for carrier aggregation. For example, in an aspect it may be beneficial for a device to support carrier aggregation using bands 2 and 4. As shown in the diagram 400, the transmission and reception bands of band 4 overlap with the transmission and reception bands of band 66 while the transmission and reception bands of band 2 overlap with the transmission and reception bands of band 25. Effectively, carrier aggregation over bands 2 and 4 is therefore equivalent to carrier aggregation using band 66 and 25. In addition to carrier aggregation using band 66 (4) and 25 (2), it may be beneficial for a device to also support carrier aggregation using bands 66 and 70. As a result, between the three bands 25, 66, and 70, it may be beneficial for a wireless device 110 to support carrier aggregation over bands 66 and 25 as well as over bands 66 and 70.

Certain inter-band carrier aggregation pairs can be supported by connecting two duplexers together at a common antenna port (with matching components) to form a quadplexer. The quadplexer has two transmission bands and two reception bands (e.g., four filters). However, as shown in the diagram 400, the transmission range of band 70 is adjacent to the transmission range of band 66. In addition, the reception range of band 70 is adjacent to the reception range of band 25. Because the transmission range of band 70 is adjacent to the transmission range of band 66, it may not be possible to combine two separate filters in such a way to support both bands independently and therefore such a quadplexer for this band combination may not be feasible. As such, additional and potentially duplicative filter elements would be required to enable functionality to support both single modes and carrier aggregation pairs which increases complexity and cost.

Figure 5B:
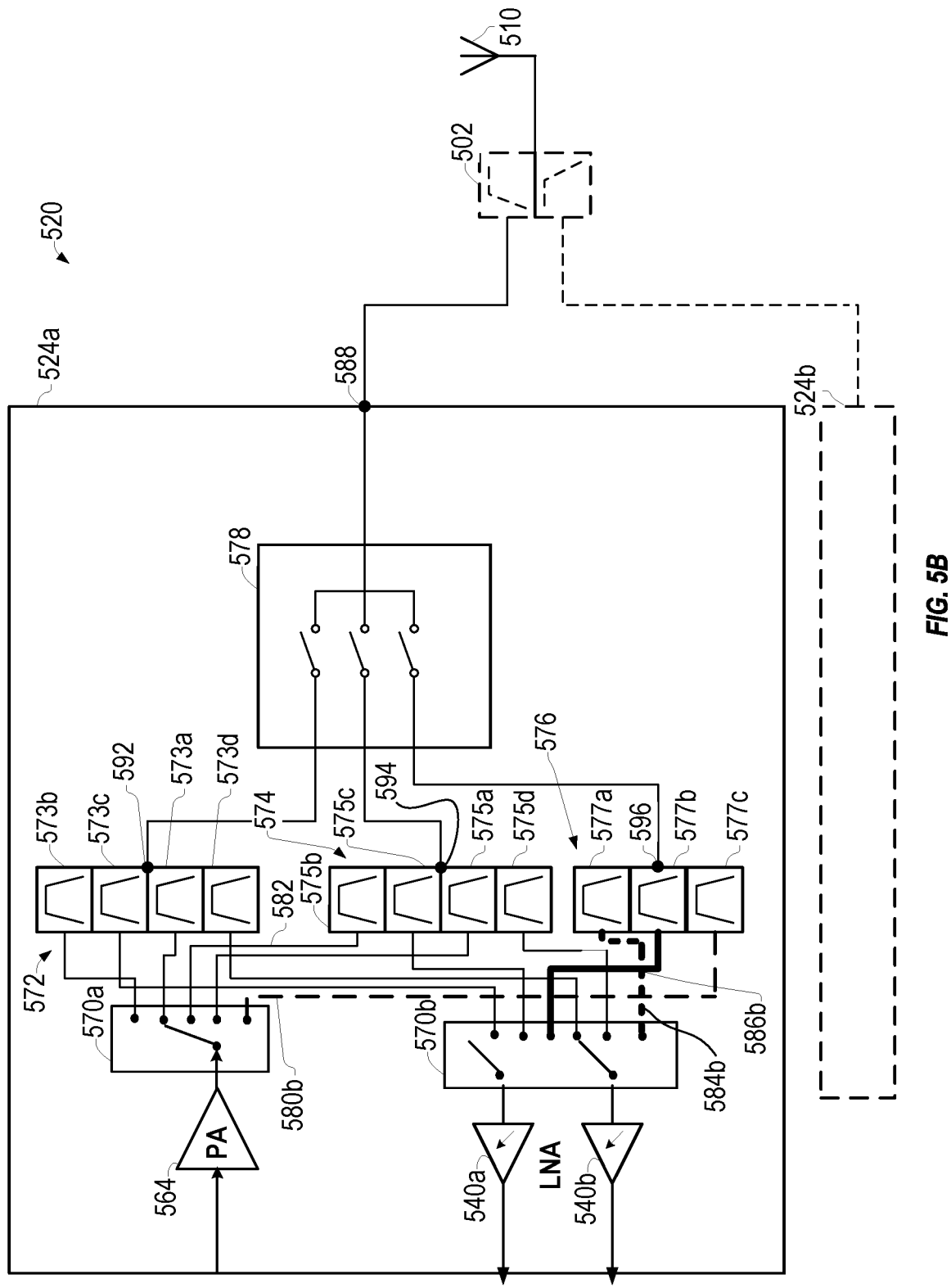

FIGS. 5A and 5B are schematic diagrams of an example of a portion of a front-end circuit 524a of a transceiver circuit 520 of the wireless device 110 of FIG. 2. FIGS. 5A and 5B illustrate one example of additional and duplicative filters that may be provided to support the two carrier aggregation modes (e.g., two carrier aggregation pairs as described with reference to FIG. 4) that may increase complexity and cost.

A portion of the front-end circuit 524a may correspond to the antenna interface circuit 224 of FIG. 2. However, the front-end circuit 524a also includes a power amplifier 564 (for a transmit path) and other low noise amplifiers 540a and 540b (for two separate receive paths) similar to those described with reference to the transceiver 220 of FIG. 2. In certain aspects, the front-end circuit 524a may correspond to a module such as a power amplifier module integrated duplexer (PAMiD) which may include the power amplifier 564, filters, and antenna switches among other components. In other implementations, the power amplifier 564 may be on a separate module and the front-end circuit 524a may include filters and antenna switches to form a front end module integrated duplexer (FEMiD). However, in other implementations other components may be separated into the same or different integrated circuits/modules in other combinations.

The front-end circuit 524a may be configured for handling signals having one or more frequencies in a certain range such as mid-band (e.g., roughly between 1 GHz and 6 GHz), high-band (e.g., greater than 6 GHz), or low-band (e.g., less than 1 GHz). For example, the front-end circuit 524a shown in FIG. 5A may be configured to support mid-band communications and is connected to transmitter and receiver circuits as described with reference to FIG. 2 configured to process one or more signals within this range. The transceiver circuit 520 may have a second front-end circuit 524b that is configured to support another frequency range such as low-band. However, the second front-end circuit 524b is shown as optional.

To allow sharing of an antenna 510 between the two front-end circuits 524a and 524b (e.g., and respective transmitter/receiver circuitry for each of the ranges), the transceiver circuit 520 includes a diplexer 502 (shown as optional) electrically connected between the antenna 510 and the first front-end circuit 524a as well as between the antenna 510 and the second front-end circuit 524b. The diplexer 502 includes one or more filter components (e.g., to form high pass and low pass passbands) to route signals to and from the appropriate front-end circuit 524a or 524b based on the frequency.

The front-end circuit 524a is configured to support multiple transmit paths and receive paths based on signals operating in different bands within the mid-band range along with different carrier aggregation modes where multiple bands are simultaneously used for transmission/reception (e.g., using frequency division duplexing (FDD) modes). The front-end circuit 524a includes an antenna switch network 578 that includes one or more switching elements configured to selectively connect one or more inputs received from transmit and/or receive paths to an antenna connection port 588. In certain modes, just one input may be connected to the antenna connection port 588 via the antenna switch network 578 during some period of time (e.g., just one of the switching elements is closed). In other modes, (e.g., certain carrier aggregation modes where multiple bands are active simultaneously), multiple inputs may be simultaneously connected to the antenna connection port 588 via the antenna switch network 578 (e.g., multiple switches may be closed at the same time). It should be appreciated that there may be other elements electrically connected between the antenna connection port 588 and the antenna 510 (e.g., such as the diplexer 502). The antenna connection port 588 therefore represents an interface for routing one or more signals from the front-end circuit 524a to a circuit path that leads to the antenna 510.

The front-end circuit 524a further includes multiple filter components 572, 574, and 576 configured to provide filtering for multiple bands alone or in combination. The front-end circuit 524a includes a transmit path switch network 570a and a receive path switch network 570b for routing signals between the filter components 572, 574, and 576 and one or more transmit paths including the power amplifier 564 and one or more receive paths including the low noise amplifiers 540a and 540b.

The front-end circuit 524a includes a first quadplexer 572 including four filter components 573a, 573b, 573c, and 573d connected to a first common filter port 592. The first quadplexer 572 may be configured to provide filtering for a first band and a second band (e.g., two transmission bands and two reception bands corresponding to the four filter components 573a, 573b, 573c, and 573d). The two transmission filter components 573a and 573b are electrically connected to the transmit path switch network 570a while the two reception filter components 573c and 573d are electrically connected to the receive path switch network 570b. The filter components described herein may be implemented by any one of a number of different filter techniques such as using acoustic wave devices (e.g., surface acoustic wave (SAW) or bulk acoustic wave (BAW) components/resonator), LC topologies, transmission line filters, ceramic based filters, and the like.

The front-end circuit 524a includes a second quadplexer 574 including four filter components 575a, 575b, 575c, and 575d connected to a second common filter port 594. The second quadplexer 574 may be configured to provide filtering for a third band and a fourth band (e.g., defined by two transmission bands and two reception bands corresponding to the four filter components 575a, 575b, 575c, and 575d). The third and fourth bands are different than the first and second bands for which the first quadplexer 572 is designed for. The two transmission filter components 575a and 575b are electrically connected to the transmit path switch network 570a while the two transmission filter components 575c and 575d are electrically connected to the receive path switch network 570b.

With the first quadplexer 572 and the second quadplexer 574 the front-end circuit is configured to support one or more signals over the four bands by appropriately switching the corresponding connections in both the antenna switch network 578 and the transmit and receive path switch networks 570a and 570b. Furthermore, the first quadplexer 572 is configured to support carrier aggregation using the first band and the second band (e.g., can transmit/receive simultaneously over both the first band and the second band) while the second quadplexer 574 is configured to support carrier aggregation using the third and fourth bands.

In one example, the third and fourth bands as described with reference to the second quadplexer 574 of FIGS. 5A and 5B may correspond to bands 25 and 66 as mentioned with respect to the diagram 400 of FIG. 4. In addition, as mentioned with respect to the diagram 400 of FIG. 4 it may be beneficial to support another band 70 (e.g., a fifth band) as well as carrier aggregation for both combinations of band 66 and 25 as well as between band 66 and 70. As also described above with reference to FIG. 4, because the transmission bands of bands 66 and 70 are adjacent to each other, additional filters may be needed to support this operation.

More particularly, with reference to FIGS. 5A and 5B, the front-end circuit 524a includes a triplexer 576 connected to a third common filter port 596. The triplexer 576 includes a common transmission filter component 577c (e.g., covering the transmission ranges of both bands 66 and 70) along with two separate receive filter components 577a and 577b filter components (e.g., one for the receive band of band 66 and one for the receive band of band 70). According to a carrier aggregation scenario where both combinations of bands 66 and 24 or bands 66 and 70 are supported, the duplexer for band 66 (including filter components 575c and 575d) is therefore effectively duplicated by the combination of the receive filter component 577a and transmission filter 577c in the triplexer 576. This duplication increases costs and complexity.

In addition, to support both carrier aggregation cases (e.g., via bands 66 and 70 as well as bands 25 and 66), a transmit path for band 66 would need to be calibrated twice (for each carrier aggregation mode separately) since path losses could be different. More particularly, FIG. 5A illustrates the active paths when performing carrier aggregation using bands 25 and 66 (e.g., via the second quadplexer 574). In this case, transmit paths 582 and 580 are active while receive paths 584 and 586 are active. FIG. 5B illustrates the active paths when performing carrier aggregation using bands 66 and 70. In this case, the active transmit path is 580b through the transmit filter 577c of the triplexer 576 while receive paths 584b and 586b are active (e.g., such that received signals are routed to their own respective LNAs). In this case, the active transmit path for a single mode scenario for band 66 and the two carrier aggregation scenarios involving band 66 may be different in each case (e.g., go through different filters even though it is the same band) requiring different calibrations for potentially different path losses.

Note that while the front-end circuit 524a shows a combination of filter and switch elements to support five bands, in other implementations the front-end circuit 524a may have fewer or additional components to support more or fewer bands. In addition, the front-end circuit 524a may support other transmit paths (not shown) such as by including another power amplifier that may support another transmit communication technology (e.g., GSM).

Aspects of the disclosure relate to implementations that avoid duplication of filter components or filter functions while also supporting two different carrier aggregation modes among three bands where at least some of the bands are adjacent or close to each other. As one particular example, aspects of the disclosure relate to a filter configuration that supports carrier aggregation over both bands 25 and 66 as well as over bands 66 and 70 where the transmission bands of bands 66 and 70 are adjacent while the reception bands of bands 25 and 70 are also adjacent. However, principles described herein may be equally applicable to other band combinations. For example, other bands that may be considered for various carrier aggregation scenarios according to the principles described herein include bands 28 and 20 (B28: Tx 703-748 MHz, Rx 758-803 MHz; B20 Tx 832-862 MHz, Rx 791-821 MHz-as receive bands of 28 and 20 may be combined for one filter) and/or bands 12 and 71 (B12 Tx 699-716 MHz, Rx 729-746 MHz, B71 Tx 617-652 MHz, Rx 663-698 MHz-as transmission bands of 12 and 71 can be combined to one filter). As another example, bands 12, 13, and 14 could be considered (B12 Tx 699-716 MHz, Rx 729-746 MHz; B13 Tx 777-787 MHz, Rx 746-758 MHz; B14 Tx 788-798 MHz, Rx 758-768 MHz). As a further example, a combination of bands 3, 7, and 69 may be applicable to certain principles described herein (B3 Tx 1705-1785 MHz, Rx 1805-1880 MHz; B7 Tx 2500-2570 MHz, Rx 2620-2690 MHz; B69 (Rx only) Rx 2570-2620 MHz, B41 (TDD) 2496-2690 MHz). These bands are full illustration only and may involve slightly different combinations of filters where at least one of the filters spans transmission or reception ranges of more than one band.

In an aspect of the disclosure, a single quadplexer structure with transmission and reception filter components having passbands to cover multiple bands is provided to support three bands in a single mode while also supporting two carrier aggregation pairs among the three bands. Particularly, in an example a quadplexer includes a lower transmit filter with a passband that covers both the transmission ranges of a first and second band. The quadplexer further includes a lower receive filter with a passband that covers both the reception ranges of the first and a third band. An upper transmit filter for the third band and an upper receive filter for the second band is also provided to form the four filters of the quadplexer. The single quadplexer structure is configured to support these modes without duplication of filtering for the different cases. As compared to the implementation shown with respect to FIGS. 5A and 5B the number of required filters is reduced from seven to four. Furthermore one calibration for each transmit path is sufficient as losses remain the same irrespective of whether single band, or either of the carrier aggregation modes is selected.

Figure 6:
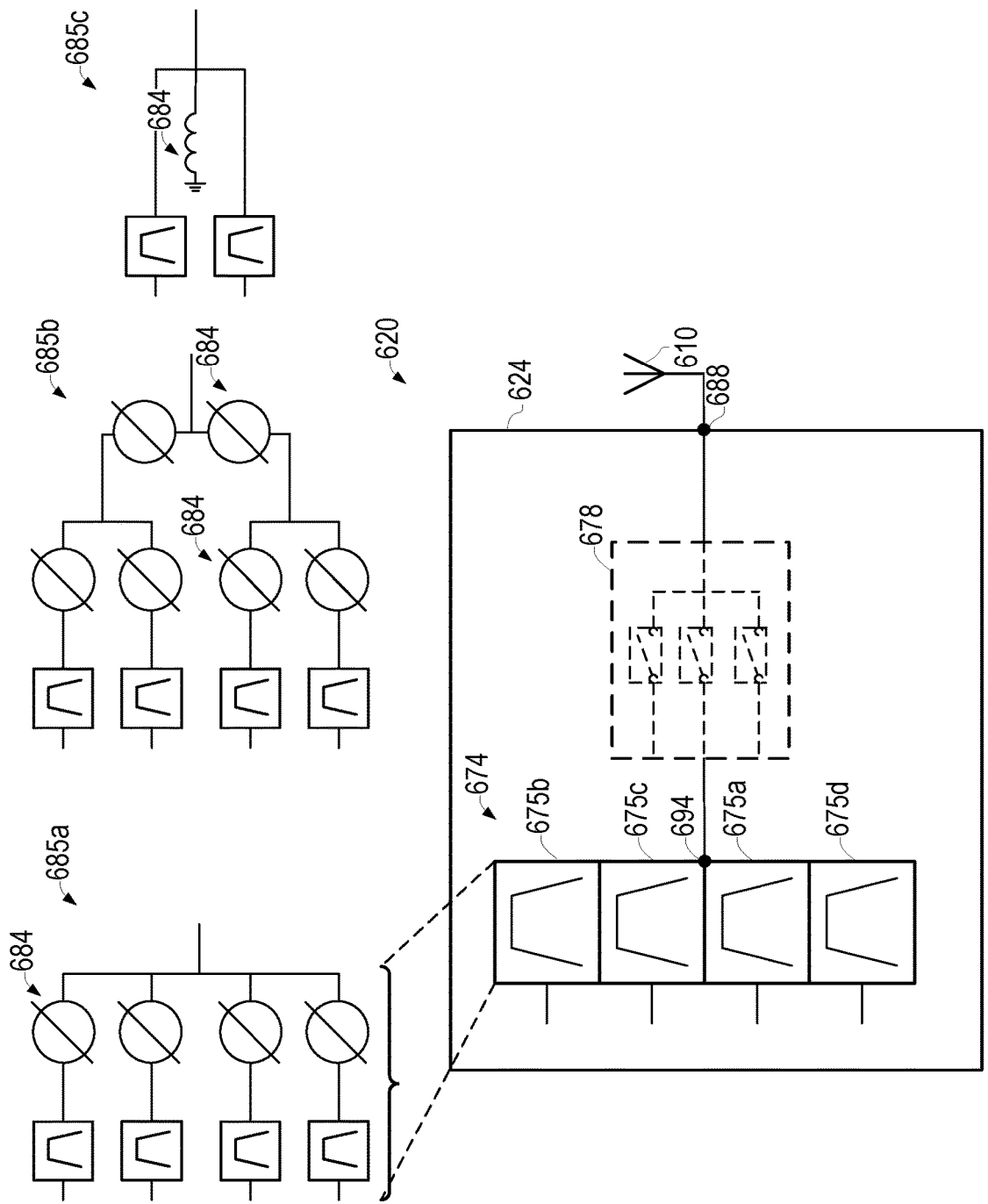
FIG. 6 is a schematic diagram of an example of a portion of a plurality of filter circuits within a front-end circuit of a transceiver circuit of the wireless device of FIG. 2 according to aspects of the present disclosure.

FIG. 6 is a schematic diagram of an example of a portion of a plurality of filter circuits 674 within a front-end circuit 624 of a transceiver circuit 620 of the wireless device 110 of FIG. 2 according to aspects of the present disclosure. In an aspect, the plurality of filter circuits 674 may form a quadplexer and be connected to a common port 694.

The plurality of filter circuits 674 is configured to filter one or more signals transmitted and received over at least one of a first predefined communication band defined by a first transmission frequency range and a first reception frequency range, a second predefined communication band defined by a second transmission frequency range and a second reception frequency range, and a third predefined communication band defined by a third transmission frequency range and a third reception frequency range.

The plurality of filter circuits 674 includes a first filter component 675a configured to have a first passband that spans both the first transmission frequency range of the first predefined communication band and the second transmission frequency range of the second predefined communication band where the first transmission frequency range is substantially adjacent to the second transmission frequency range. In an aspect the first filter component 675a is configured as a transmit path filter (e.g., transmit filter).

The plurality of filter circuits 674 includes a second filter component 675b having a second passband that spans the third transmission frequency range of the third predefined communication band. In an aspect, the second filter component 675b is configured as a transmit path filter (e.g., transmit filter).

The plurality of filter circuits 674 includes a third filter component 675c having a third passband that spans both the first reception frequency range of the first predefined communication band and the third reception frequency range of the third predefined communication band where the third reception frequency range is substantially adjacent to the first reception frequency range. In an aspect, the third filter component 675c is configured as a receive path filter (e.g., receive filter).

The plurality of filter circuits 674 includes a fourth filter component 675d configured to have a fourth passband that spans the second reception frequency range of the second predefined communication band. In an aspect, the fourth filter component 675d is configured as a receive path filter (e.g., receive filter).

In certain implementations, the third transmission frequency range is higher in frequency than the first transmission frequency range and the second transmission frequency range. Stated another way, the first filter component 675a forms a lower transmit filter circuit relative to the second filter component 675b (e.g., lower in frequency). In another aspect, the second reception frequency range is higher in frequency than the first reception frequency range and the third reception frequency range. Stated another way the third filter component 675c forms a lower receive filter relative to the fourth filter component 675d (e.g., lower in frequency).

As stated, the plurality of filter circuits 674 may be configured to form a portion of a quadplexer. As such, the first filter component 675a, the second filter component 675b, the third filter component 675c, and the fourth filter component 675d share a common port 694. In an aspect, the quadplexer includes one or more phase shifting components electrically connected to at least one of the first filter component 675a, the second filter component 675b, the third filter component 675c, and the fourth filter component 675d, or any combination thereof. The phase shifting components may also be referred to as matching components.

For example, FIG. 6 illustrates example configurations of the filter components configured with phase shifters 684 in one or more configurations to form quadplexer or duplexer configurations. Particularly, when combining two filters the impedance of each filter is configured to appear like an open in the passband of the other filter (in general in the passband the impedance is typically at 50 Ohms). The phase shifters 684 in different configurations provide the desired impedance transformation as the phase shifters 684 are configured to cause the impedance to be sufficiently reactive outside of the passband. By selecting phase shifting components 684 and connecting them between the filters (see examples 685a, 685b, and 685c shown in FIG. 6) a quadplexer is provided that allows for the filters to function when connected to the common port 694. In certain implementations, based on the desired impedance, two phase shifters in a duplexer can be reduced to, for example, a single inductor to ground at the common port 694 (as shown by the example 685c). As such, not all the phase shifters shown in the examples 685a, 685b may need to correspond to individual discrete components (and some of the phase shifters shown could have a phase shift very close to zero). Rather, a select number of inductors and/or capacitors can be connected to be configured to achieve the phase shifting function desired to have the appropriate impedance be presented to the filter components in each of their passbands (e.g., achieve the matching of the four filter components 675a, 675b, 675c, and 675d to the common port 694).

In an aspect, the phase shifting components 684 are electrically coupled between the common port 694 and each of the first filter component 675a, the second filter component 675b, the third filter component 675c, and the fourth filter component 675d. As such, the resulting quadplexer allows for the four filter components 675a, 675b, 675c, and 675d to function when sharing the common port 694 in a way to support the three bands in single mode or both carrier aggregation pairs (e.g., the first band with the second band simultaneously or the second band with the third band simultaneously).

The transceiver circuit 620 is configured to operate in a first carrier aggregation mode to transmit or receive the one or more signals over a combination of the first predefined communication band and the second predefined communication band in a frequency division duplexing mode. Stated in another way, the plurality of filter circuits 674 is configured to filter one or more signals while the one or more signals are transmitted or received in a frequency division duplexing mode over a combination of the first predefined communication band and the second predefined communication band. As one illustrative example, the first predefined communication band may correspond to band 70 while the second predefined communication band may correspond to band 66 such that the transceiver circuit 620 is configured to perform carrier aggregation over bands 70 and 66.

The transceiver circuit 620 is further configured to operate in a second carrier aggregation mode to transmit or receive the one or more signals over a combination of the second predefined communication band and the third predefined communication band. Stated another way, the plurality of filter circuits 674 is configured to filter the one or more signals while the one or more signals are transmitted or received in the frequency division duplexing mode over a combination of the second predefined communication band and the third predefined communication band. As one example, the second predefined communication band may correspond to band 66 while the third predefined communication band may correspond to band 25 such that the transceiver circuit 620 is configured to perform carrier aggregation over bands 66 and 25.

The transceiver circuit 620 is further configured to operate in a single band mode to transmit or receive the one or more signals over any of the first predefined communication band, the second predefined communication band, or the third predefined communication band.

While not shown in FIG. 6, the transceiver circuit 620 further includes a power amplifier and a connection port 688 configured to electrically connect to an antenna 610. In this case at least one of the plurality of filter circuits 674 is selectively electrically connected between the power amplifier and the connection port 688 (there may be intervening circuit elements between either the power amplifier and the plurality of filter circuits 674 or the antenna 610).

Furthermore, the front-end circuit 624 may include one or more electronic switching components 678 electrically connected between the plurality of filter circuits 674 and the connection port 688 configured to electrically connect to an antenna 610. Connections to other inputs of the electronic switching components 678 are not shown in FIG. 6 but are there to show that there may be other filter circuits selectively connected to the connection port 688. As such, in certain implementations there may optionally be a switch between the output of the plurality of filter circuits 674 and the connection port 688 to selectively connect the plurality of filter circuits 674 to the connection port 688 and on to antenna 610. The electronic switching component 678 are shown optional in FIG. 6 to illustrate that the plurality of filter circuits 674 may be provided in various implementations or in a module which connects to an antenna interface without including other filters.

In certain aspects, the transceiver circuit 620 may include one or more other filter circuits and a plurality of switching components where the plurality of switching components are electrically connected between a node and both the plurality of filter circuits and the one or more other filter circuits. An example of the one or more other filter circuits in addition to the plurality of filter circuits 674 is illustrated with respect to FIGS. 9A and 9B.

In certain aspects, the transceiver circuit 620 includes a diplexer electrically connected between an antenna 610 and the plurality of filter circuits 674.

The frequency ranges are described as adjacent above. In an aspect, adjacent may indicate that any gap, if any, between the first transmission frequency range and the second transmission frequency range is less than a minimum channel width, and where any gap between the third reception frequency range and the first reception frequency range is less than the minimum channel width. However, in some cases the principles described herein may apply for frequency ranges where a some gap exist but where the passband of the filters as described above may span both frequency ranges. In addition, in an aspect, the frequency ranges of two bands that are adjacent are non-overlapping.

In an aspect, the plurality of filter circuits comprises one or more acoustic wave resonators for example such as at least one of a surface acoustic wave component or a bulk acoustic wave component.

Figure 7:
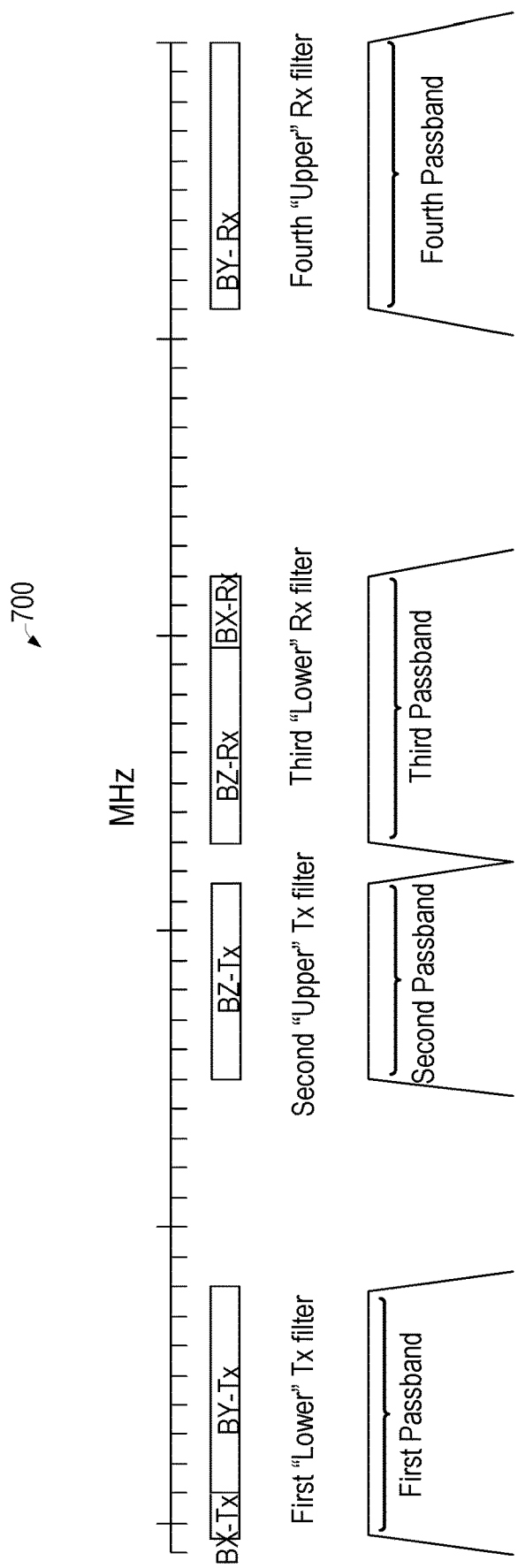
FIG. 7 is a diagram illustrating an example of filtering characteristics of the plurality of filter circuits of FIG. 6 according to aspects of the present disclosure.

FIG. 7 is diagram 700 illustrating an example of filtering characteristics of the plurality of filter circuits 674 of FIG. 6 according to aspects of the present disclosure. The diagram 700 illustrates the passbands of each of the four filter components 675a, 675b, 675c, and 675d relative to one another and as they relate to the bands covered. The first passband shown in the diagram 700 of the first filter component 675a spans the adjacent transmission bands of the first transmission frequency range (labeled as BX-Tx) of the first predefined communication band and the second transmission frequency range (labeled as BY-Tx) of the second predefined communication band. As such, the first passband spans both transmission frequency ranges of each of the two bands BX-Tx and BY-Tx. In some cases, the two transmission bands BX-Tx and BY-Tx are adjacent. However, there may be implementations in accordance with the principles described herein that may allow for some gap between the two transmission bands while still having a passband that spans both transmission bands.

The second passband shown in the diagram 700 of the second filter component 675b spans the transmission band of the third transmission frequency range (labeled as BZ-Tx) of the third predefined communication band. The third transmission frequency range (and second passband) is higher than both of the first and second transmission frequency ranges such that in an aspect the first filter component 675a forms a lower transmission filter while the second filter component 675b forms an upper transmission filter.

The third passband shown in the diagram 700 of the third filter component 675c spans the adjacent reception bands of the first reception frequency range (labeled as BX-Rx) of the first predefined communication band and the third reception frequency range (labeled as BZ-Rx) of the third predefined communication band. As such the third passband spans both reception frequency ranges of each of the two bands. In some cases, the two reception bands BX-Rx and BZ-Rx are adjacent. However, there may be implementations in accordance with the principles described herein that may allow for some gap between the two reception frequency ranges where the passband spans the two reception frequency ranges.

The fourth passband shown in the diagram 700 of the fourth filter component 675d spans the reception band of the second reception frequency range (labeled as BY-Rx) of the second predefined communication band. The second reception frequency range (and fourth passband) is higher than both of the first and third reception frequency ranges such that in an aspect the third filter component 675c forms a lower reception filter while the fourth filter component 675d forms an upper reception filter.

In accordance with this a single quadplexer formed by the plurality of filter circuits 674 is provided that allows for supporting carrier aggregation for the first predefined communication band (BX) and the second predefined communication band (BY) as well as by the third predefined communication band (BY) and the second predefined communication band (BZ)

Figure 8:
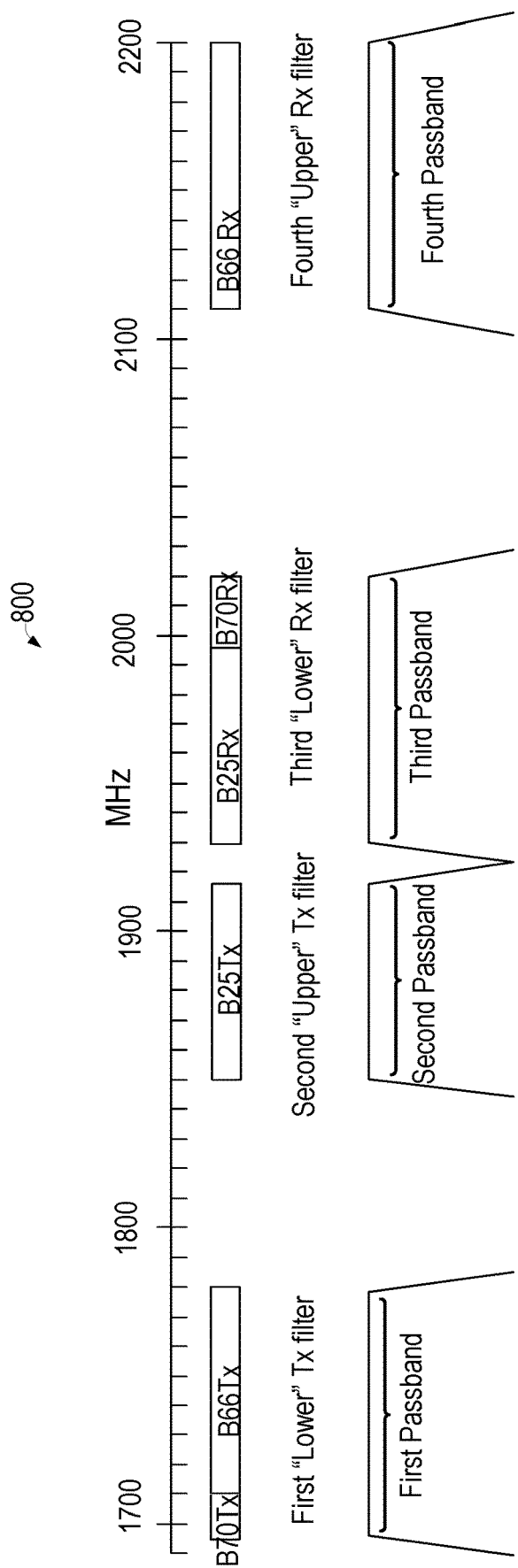
FIG. 8 is a diagram illustrating another example of filtering characteristics of the plurality of filter circuits of FIG. 6 according to aspects of the present disclosure.

FIG. 8 is diagram 800 illustrating another example of filtering characteristics of the plurality of filter circuits 674 of FIG. 6 according to aspects of the present disclosure. The diagram 800 of FIG. 8 provides one example of particular frequency bands that may be implemented by the plurality of filter circuits 674 of FIG. 6.

Particularly, in the example illustrated by the diagram 800, the first predefined communication band corresponds to long term evolution (LTE) defined band 70, the second predefined communication band corresponds to LTE defined band 66, and the third predefined communication band corresponds to LTE defined band 25.

More particularly, in this example, the first transmission frequency range of the first predefined communication band includes frequencies between 1695 MHz and 1710 MHz while the first reception frequency range of the first predefined communication band includes frequencies between 1995 MHz and 2020 MHz. Furthermore in this example, the second transmission frequency range of the second predefined communication band includes frequencies between 1710 MHz and 1780 MHz and the second reception frequency range of the second predefined communication band includes frequencies between 2110 MHz and 2200 MHz. In addition, according to this example, the third transmission frequency range of the third predefined communication band includes frequencies between 1850 MHz and 1915 MHz and the third reception frequency range of the third predefined communication band includes frequencies between 1930 MHz and 1995 MHz.

In this example, the first filter component 675a is configured to have a passband that spans the band 70 transmission frequency range (B70Tx) and the band 66 transmission frequency range (B66Tx). The second filter component 675b is configured to have a passband that spans the band 25 transmission frequency range (B25tx). The third filter component 675c is configured to have a passband that spans the band 25 reception frequency range and the band 70 reception frequency range. The fourth filter component 675d is configured to have a passband that spans the band 66 reception frequency range.

Figure 9A:
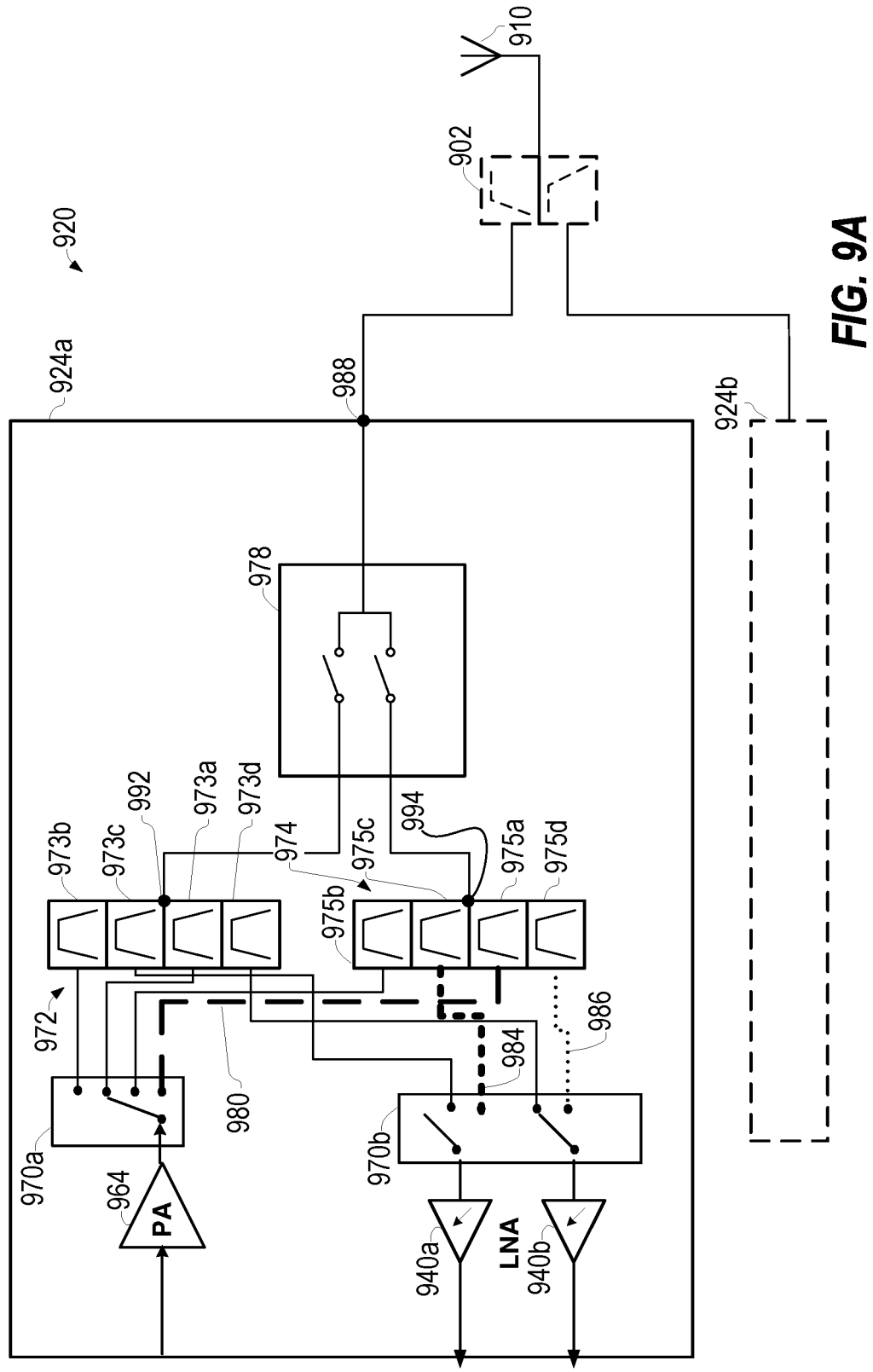
FIGS. 9A and 9B are schematic diagrams of an example of a portion of a front-end circuit of a transceiver circuit of the wireless device of FIG. 2 using the plurality of filter circuits of FIG. 6 according to aspects of the present disclosure.
Figure 9B:
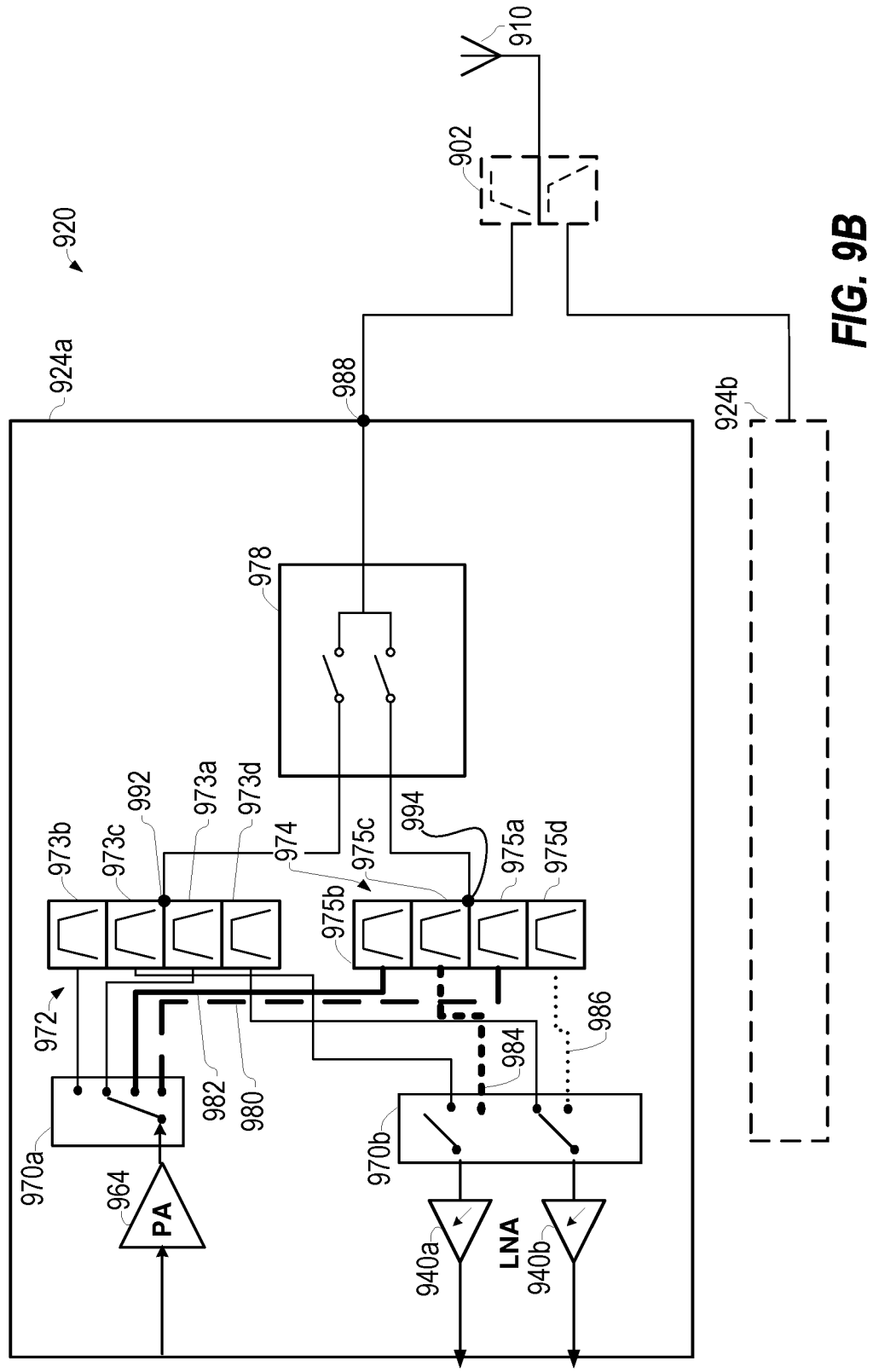

FIGS. 9A and 9B are schematic diagrams of an example of a portion of a front-end circuit 924a of a transceiver circuit 920 of the wireless device 110 of FIG. 2 using the plurality of filter circuits 674 of FIG. 6 according to aspects of the present disclosure. In particular, the quadplexer 974 of FIGS. 9A and 9B may correspond to the plurality of filter circuits 674 of FIG. 6. FIGS. 9A and 9B illustrate additional components that may be involved to illustrate the operation of the carrier aggregation modes using the quadplexer 974 of FIGS. 9A and 9B and in comparison to the front-end circuit 524a of FIGS. 5A and 5B.

A portion of the front-end circuit 924a may correspond to the antenna interface circuit 224 of FIG. 2. However, the front-end circuit 924a also includes a power amplifier 964 (for a transmit path) and other low noise amplifiers 940a and 940b (for separate receive paths) similar to those described with reference to the transceiver 220 of FIG. 2. In certain aspects, the front-end circuit 924a may correspond to a module such as a power amplifier and duplexer module (PAMiD) which may include the power amplifier 964, filters, and antenna switches among other components. In other implementations, the power amplifier 964 may be on a separate module and the front-end circuit 924a may include filters and antenna switches (FEMiD module). However, in other implementations other components may be separated into the same or different integrated circuits/modules in other combination.

The front-end circuit 924a may be configured for handling signals having one or more frequencies in a certain range such as mid-band (e.g., roughly between 1 GHz and 6 GHz), high-band (e.g., greater than 6 GHz), or low-band (e.g., less than 1 GHz). For example, the front-end circuit 924a shown in FIG. 9A is configured to support mid-band communications and is connected to transmitter and receiver circuits as described with reference to FIG. 2 configured to process one or more signals within this range. The transceiver circuit 920 may have a second front-end circuit 924b that is configured to support another frequency range such as low-band. However, the second front-end circuit 924b is shown as optional.

To allow sharing of an antenna 910 between the two front-end circuits 924a and 924b (e.g., and respective transmitter/receiver circuitry for each of the ranges), the transceiver circuit 920 includes a diplexer 902 (shown as optional) similar to that described above with reference to FIGS. 5A and 5B.

The front-end circuit 924a is configured to support multiple transmit and receive paths based on signals operating in different bands within the mid-band range along with different carrier aggregation modes where multiple bands are simultaneously transmitted/received. The front-end circuit 924a includes an antenna switch network 978 that may include one or more switching elements configured to selectively connect one or more inputs received from transmit or receive paths to an antenna connection port 988. It should be appreciated that there may be other elements (e.g., the diplexer 502) electrically connected between the antenna connection port 988 and the antenna 910 and the antenna connection port 988 represents an interface for routing one or more signals from the front-end circuit 924a to a circuit path that leads to the antenna 910.

The front-end circuit 924a further includes multiple filter components 972 and 974 configured to provide filtering for multiple bands alone or in combination. The front-end circuit 924a includes a transmit path switch network 970a and a receive path switch network 970b for routing signals between the filter components 972 and 974 and one or more transmit paths including the power amplifier 964 and one or more receive paths including the low noise amplifiers 940a and 940b.

The front-end circuit 924a includes a first quadplexer 972 including four filter components 973a, 973b, 973c, and 973d connected to a first common port 992. The first quadplexer 972 may be configured to provide filtering over at least two bands (e.g., two transmission bands and two reception bands corresponding to each for the four filter components 973a, 973b, 973c, and 973d). The two transmission filter components 973a and 973b are electrically connected to the transmit path switch network 970a while the two reception filter components 973d and 973d are electrically connected to the receive path switch network 970b.

The front-end circuit 924a includes a second quadplexer 974 including four filter components 975a, 975b, 975c, and 975d connected to a second common port 994. The second quadplexer 974 may correspond to a quadplexer formed by the plurality of filter circuits 674 of FIG. 6. Accordingly, the first filter component 975a may correspond to the first filter component 675a of FIG. 6 and likewise for the other filter components 975b, 975c, and 975d. As described with reference to FIG. 6, the first filter component 975a is configured to have a passband that spans both a first transmission frequency range of a first predefined communication band and a second transmission frequency range of a second predefined communication band. The second filter component 975b is configured to have a passband that spans a third transmission frequency range of a third predefined communication band different from the first and second communication bands. The third filter component 975c is configured to have a passband that spans both a first reception frequency range of the first predefined communication band and a third reception frequency range of the third predefined communication band. The fourth filter component 975d is configured to have a passband that spans a second reception frequency range of the second predefined communication band.

The two transmission filter components 975a and 975b are electrically connected to the transmit path switch network 970a while the two reception filter components 975c and 975d are electrically connected to the receive path switch network 970b.

The transceiver circuit 920, via the second quadplexer 974 is configured to transmit or receive signals in single modes over any of the first, second, or third predefined communication bands. The transceiver circuit 920 is also configured to perform carrier aggregation over the first and second predefined communication bands. This is illustrated in FIG. 9A. For example, as shown in FIG. 9A, when the transmit path 980 is active, the power amplifier 964 is electrically connected to transmit signals through the first filter component 975a whose pass band spans both of the first transmission frequency rage of the first predefined communication band and the second transmission frequency range of the second predefined communication band. In this case the transceiver 920 can transmit via either the first predefined communication band or the second predefined communication band.

Two active receive paths 984, 986 are shown in FIG. 9A. When the first receive path 984 is active, the first LNA 940a is connected to receive signals through the third filter component 975c that has a passband that spans both the first reception frequency range of the first predefined communication band and the third reception frequency range of the third predefined communication band. This allows signals to be received and be routed to the first LNA 940a in the first predefined communication band. In addition, when the second receive path 986 is active, the second LNA 940b is connected to receive signals through the fourth filter component 975d that has a passband that spans the second reception frequency range of the second predefined communication band. This allows signals to be received and be routed to the second LNA 940b in the second predefined communication band. The transceiver circuit 920 is configured to activate all three paths 980, 984, and 986 simultaneously. As such, signals in one of the transmit frequency ranges of either the first or second predefined communication bands are transmitted while the transceiver 920 is configured to receive signals over the first and second predefined communication bands. In this case the bottom switch of the antenna switch network 978 is activated (e.g., closed) to connect to the antenna 910 via the antenna interface port 988.

In addition to performing carrier aggregation of the first and second predefined communication bands, the transceiver circuit 920 may also be configured to perform carrier aggregation over the second and third predefined communication bands. This is illustrated in FIG. 9B. In this carrier aggregation mode there may be two active transmit paths for either the second or third predefined communication bands. For the first transmit path 980, the power amplifier 964 is electrically connected to transmit signals through the first filter component 975a whose pass band spans both of the first transmission frequency rage of the first predefined communication band and the second transmission frequency range of the second predefined communication band. In this case the transceiver 920 can transmit via the second predefined communication band. Additionally, for the second transmit path 982, the power amplifier 964 is electrically connected to transmit signals through the second filter component 975b with a passband that spans the transmission frequency range of the third predefined communication band. In this case the transceiver 920 can transmit via the third predefined communication band. In an aspect, only one of the first or second transmit paths 980 or 982 may be active at a time in this mode although it may be possible for both to be active in other modes.

Two active receive paths 984, 986 are shown in FIG. 9B. When the first receive path 984 is active, the first LNA 940a is connected to receive signals through the third filter component 975c that has a passband that spans both the first reception frequency range of the first predefined communication band and the third reception frequency range of the third predefined communication band. This allows signals to be received and be routed to the first LNA 940a in the third predefined communication band. In addition, when the second receive path 986 is active, the second LNA 940b is connected to receive signals through the fourth filter component 975d that has a passband that spans the second reception frequency range of the second predefined communication band. This allows signals to be received and be routed to the second LNA 940b in the second predefined communication band. The transceiver circuit 920 is configured to activate all three paths 980 or 982, 984, and 986 simultaneously. As such, signals in one of the transmit frequency ranges of either the second or third predefined communication bands are transmitted while the transceiver 920 is configured to receive signals over the second and third predefined communication bands. In this case, the bottom switch of the antenna switch network 978 is activated (e.g., closed) to connect to the antenna 910 via the antenna interface port 988.

Note that while the front-end circuit 924a shows a combination of filter and switch elements to support five bands, in other implementations the front-end circuit 924a may have fewer or additional components to support more or fewer bands. In addition, the front-end circuit 924a may support other transmit paths (not shown) such as by including another power amplifier that may support another transmit communication technology (e.g., GSM).

As noted by the disclosure the second quadplexer 974 by itself as described with reference to FIGS. 6-9 allows for supporting three different bands in single mode and two different carrier aggregation scenarios. This reduces overall device component cost, avoids duplicate filtering, reduces calibration requirements for transmit paths, and the like.

As described above, the one or more filter components described herein may be implemented by any one of a number of different filter techniques such as using acoustic wave devices (e.g., surface acoustic wave (SAW) or bulk acoustic wave (BAW) components/resonator), LC topologies, transmission line filters, ceramic based filters, and the like.

Figure 10:
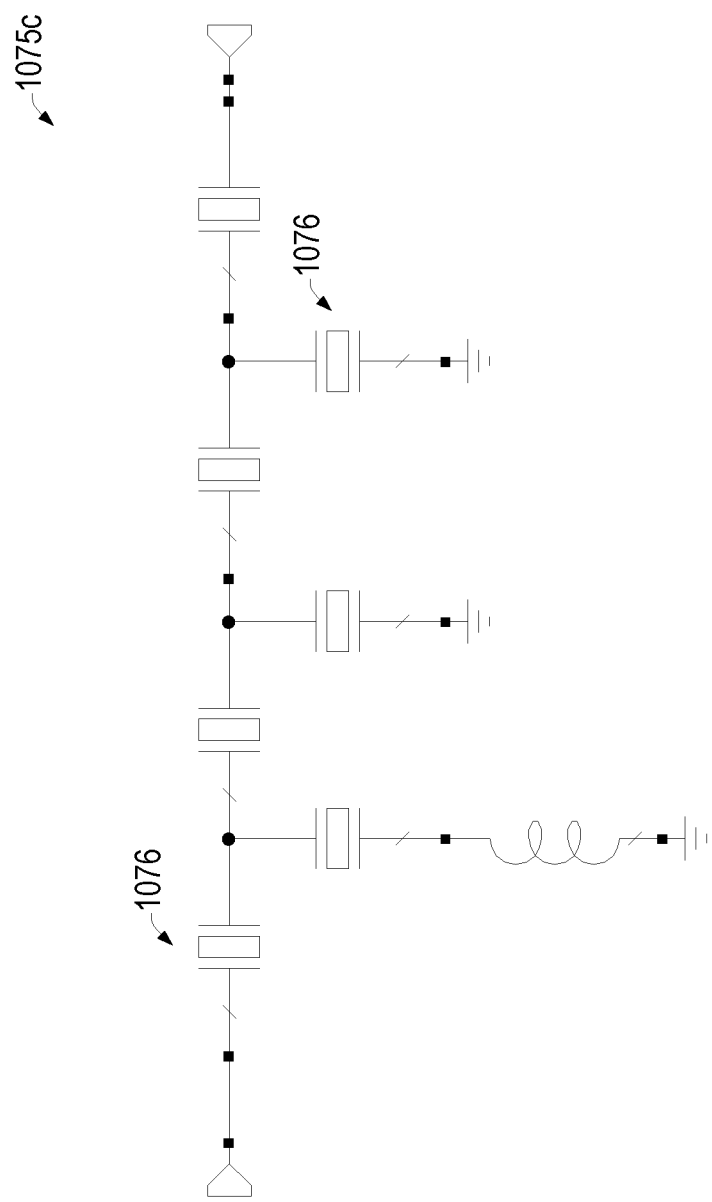
FIG. 10 is a schematic diagram of an example of an implementation of a filter component that may correspond to the filter component of FIG. 6 and that has a passband that spans the first and third reception frequency ranges.

FIG. 10 is a schematic diagram of an example of an implementation of a filter component 1075c that may correspond to the filter component 675c of FIG. 6 and that has a passband that spans the first and third reception frequency ranges. FIG. 10 provides just one example of a topology that may be used for the filter component 675c of FIG. 6. Similar topologies may be used to form the other filter components described herein according to the passbands described above. The filter component 1075c includes a ladder network topology of bulk acoustic wave (BAW) resonators 1076 connected in both series and shunt configurations (and may include one or more inductors or capacitors). Based on the selected resonator dimensions, thickness, materials, and other characteristics of the BAW resonators the desired passband may be achieved according to the topology shown. The configuration shown in FIG. 10 illustrates exemplary resonators to provide for a passband that spans the desired frequency range which in this example would span the first and third reception frequency ranges (e.g., in one particular example reception frequency ranges of both bands 25 and 70).

Figure 11:
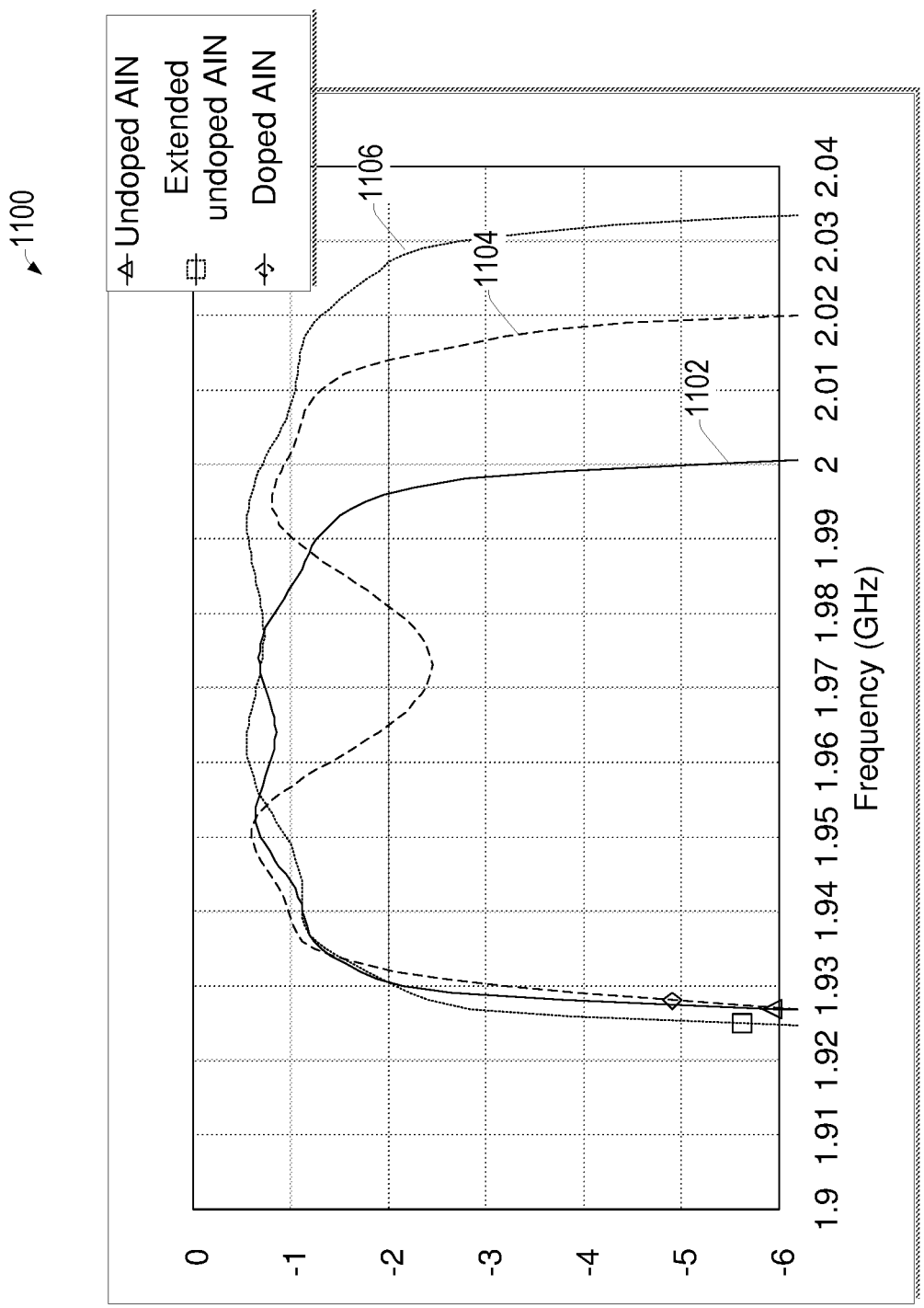
FIG. 11 is a plot of a passband of three different filter components using the topology of the filter component of FIG. 10 with different configurations to illustrate properties adjusted to achieve the passbands of the filter components described herein.

As a further illustration, FIG. 11 is a plot 1100 of a passband of three different filter components using the topology of the filter component 1075c of FIG. 10 with different configurations to illustrate properties adjusted to achieve the passbands of the filter components described herein. The curve 1102 shows the passband of a filter component that spans the third reception communication band (e.g., band 25) by itself (e.g., before the passband is expanded to become the third filter component 675c of FIG.

6 to span both reception frequency ranges). The curve 1102 represents the passband of a filter component where one or more of the BAW resonators 1076 of FIG. 10 uses undoped aluminum nitride (AlN).

The curve 1104 illustrates a passband of a filter component with an expanded pass band (e.g., spanning reception frequency ranges of 25 and 70) also using undoped A1N. In this case the resonator areas and resonance frequencies of the BAW resonators 1076 are adjusted to increase the passband in the desired area of band 70. These adjustments increase the passband, however, this passband may still be insufficient to fully satisfy a passband for both reception frequency ranges.

The third curve 1106 illustrates a passband of a filter component with a further expanded passband when using one or more BAW resonators that use doped A1N (e.g., doped with ~10% Scandium (Sc)). By adjusting the doping, the passband is expanded adequately to cover the entire range of both reception frequency ranges. In some aspects, rather than using doping to increase the passband, additional resonators may be added (e.g., for a more complex topology). This may increase the filter size but still accomplish the desired passband. Each of the curves 1102, 1104, and 1106 may use the topology shown in FIG. 10, however in each case resonator areas, resonance frequency, and other characteristics are adjusted to obtain the different passbands.

In certain implementations, aspects of FIGS. 10 and 11 may be used for each of the filter components 675a, 675b, 675c, and 675d of FIG. 6 to achieve the passbands as described above with reference to FIG. 6.

Figure 12:
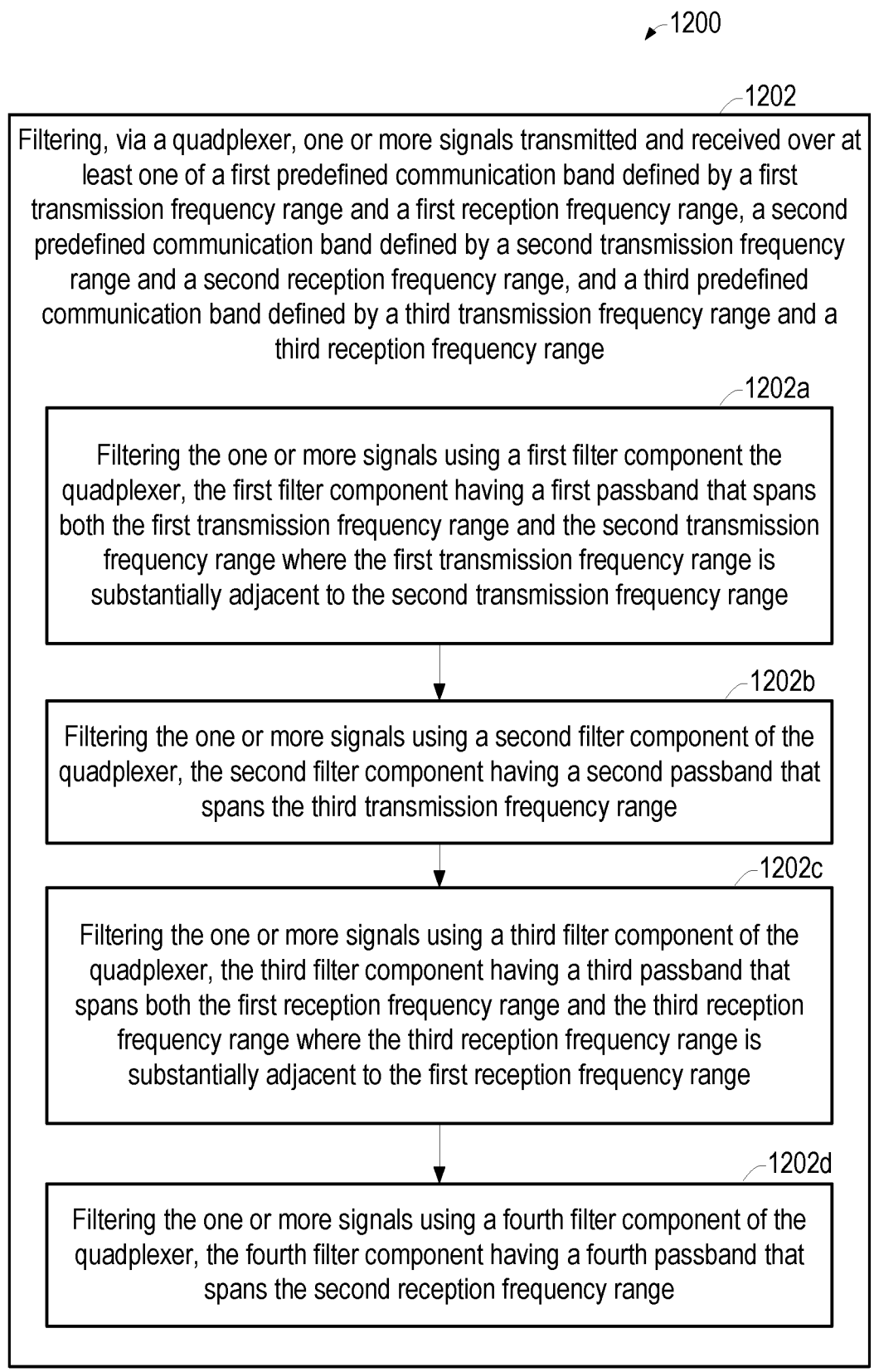
FIG. 12 is a flowchart of a method for filtering one or more signals for wireless communications.

FIG. 12 is a flowchart of a method 1200 for filtering one or more signals for wireless communications. The method 1200 is described with reference to FIGS. 9A and 9B, however the techniques described may be implemented using any of the previously described elements. Reference to elements is made by example only and is not intended to limit the ways in which the techniques can be implemented. The depicted sets of operations illustrate a few of the many ways in which the techniques may be implemented. As such, operations of a method may be repeated, combined, separated, omitted, performed in alternate orders, performed concurrently.

At block 1202, the method 1200 may include filtering, via a quadplexer, the one or more signals transmitted and received over at least one of a first predefined communication band defined by a first transmission frequency range and a first reception frequency range, a second predefined communication band defined by a second transmission frequency range and a second reception frequency range, and a third predefined communication band defined by a third transmission frequency range and a third reception frequency range.

At block 1202a, the filtering of block 1202 includes filtering the one or more signals using a first filter component 975a of the quadplexer, the first filter component having a first passband that spans both the first transmission frequency range and the second transmission frequency range where the first transmission frequency range is substantially adjacent to the second transmission frequency range.

At block 1202b, the filtering of block 1202 further includes filtering the one or more signals using a second filter component 975b of the quadplexer, the second filter component having a second passband that spans the third transmission frequency range.

At block 1202c, the filtering of block 1202 further includes filtering the one or more signals using a third filter component 975c of the quadplexer, the third filter component having a third passband that spans both the first reception frequency range and the third reception frequency range where the third reception frequency range is substantially adjacent to the first reception frequency range.

At block 1202d, the filtering of block 1202 further includes filtering the one or more signals using a fourth filter component 975d of the quadplexer, the fourth filter component having a fourth passband that spans the second reception frequency range.

While arrows are shown between the blocks 1202a, 1202b, 1202c, and 1202d it should be appreciated that any of the blocks may be operational in any order either simultaneously in any combination or individually in any order.

In an aspect, the method 1200 may further include performing carrier aggregation in a first carrier aggregation mode during a first time period to transmit and receive the one or more signals over a combination of the first predefined communication band and the second predefined communication band in a frequency division duplexing mode using a quadplexer 974. This may include, in part, simultaneously connecting a transmit path (including a power amplifier 964) and a plurality of receive paths (including multiple LNAs 940a and 940b) to the quadplexer 974 that is electrically via a common port 994 that is connected to an antenna interface port 988. For example, the transmit path may correspond to transmit path 980 in FIG. 9A (connecting the power amplifier 964 to the first filter component 975a) while the receive paths may correspond to receive paths 984 (connecting the first LNA 940a to the third filter component 975c) and 986 (connecting the second LNA 940b to the fourth filter component 975d). In one example, the first predefined communication band may correspond to band 70 while the second predefined communication band may correspond to band 66.

The method 1200 may further include performing carrier aggregation in a second carrier aggregation mode during a second time period (different than the first time period) to transmit and receive the one or more signals over a combination of the second predefined communication band and the third predefined communication band in a frequency divisional duplexing mode using the quadplexer 974. This may include, in part, simultaneously connecting a transmit path (including a power amplifier 964) and a plurality of receive paths (including multiple LNAs 940a and 940b) to the quadplexer 974 that is electrically via a common port 994 that is connected to an antenna interface port 988. For example, the transmit path may correspond to either transmit path 980 (connecting the power amplifier to the first filter component 975a) or transmit path 982 (connecting the power amplifier to the second filter component 975b) in FIG. 9B while the receive paths may correspond to receive paths 984 (connecting the first LNA 940a to the third filter component 975c) and 986 (connecting the second LNA 940b to the fourth filter component 975d). In one example, the second predefined communication band may correspond to band 66 while the third predefined communication band may correspond to band 25.

The method 1200 may further include transmitting and receiving the one or more signals in a single mode over any of the three predefined communication bands.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. For example, the means for filtering one or more signals may correspond to the plurality of filter circuits 674 of FIG. 6. For example, a first means for filtering may correspond to the first filter component 675a of FIG. 6. A second means for filtering may correspond to the second filter component 675b of FIG. 6. A third means for filtering may correspond to the third filter component 675c of FIG. 6. A fourth means for filtering may correspond to the further filter component 675d of FIG. 6.

Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general-purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The bus may also link various other circuits such as timing sources, peripherals, voltage regulators, power management circuits, and the like.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. An apparatus for filtering one or more signals for wireless communications, the apparatus comprising:
 a plurality of filter circuits configured to filter the one or more signals transmitted and received over at least one of:
  a first predefined communication band defined by a first transmission frequency range and a first reception frequency range;
  a second predefined communication band defined by a second transmission frequency range and a second reception frequency range; and
  a third predefined communication band defined by a third transmission frequency range and a third reception frequency range, the plurality of filter circuits comprising:
   a first filter component configured to have a first passband that spans both the first transmission frequency range and the second transmission frequency range, the first transmission frequency range substantially adjacent to the second transmission frequency range;
   a second filter component having a second passband that spans the third transmission frequency range;
   a third filter component having a third passband that spans both the first reception frequency range and the third reception frequency range, the third reception frequency range substantially adjacent to the first reception frequency range; and
   a fourth filter component having a fourth passband that spans the second reception frequency range.

2. The apparatus of claim 1, wherein the third transmission frequency range is higher in frequency than the first transmission frequency range and the second transmission frequency range.

3. The apparatus of claim 1, wherein the second reception frequency range is higher in frequency than the first reception frequency range and the third reception frequency range.

4. The apparatus of claim 1, wherein the first filter component, the second filter component, the third filter component, and the fourth filter component share a common port.

5. The apparatus of claim 4, wherein the first filter component, the second filter component, the third filter component, and the fourth filter component form a portion of a quadplexer.

6. The apparatus of claim 5, wherein the quadplexer comprises one or more phase shifting components electrically connected to at least one of the first filter component, the second filter component, the third filter component, the fourth filter component, or any combination thereof.

7. The apparatus of claim 6, wherein the one or more phase shifting components are electrically connected between the common port and at least one of the first filter component, the second filter component, the third filter component, or the fourth filter component.

8. The apparatus of claim 1, further comprising a power amplifier and a connection port configured to electrically connect to an antenna, wherein at least one of the plurality of filter circuits is selectively electrically connected between the power amplifier and the connection port.

9. The apparatus of claim 1, further comprising one or more electronic switching components having at least one switching component electrically connected between the plurality of filter circuits and an antenna connection port configured to electrically connect to an antenna.

10. The apparatus of claim 1, further comprising a transceiver circuit comprising the plurality of filter circuits.

11. The apparatus of claim 10, wherein the transceiver circuit is configured to operate in a first carrier aggregation mode to transmit and receive the one or more signals over a combination of the first predefined communication band and the second predefined communication band in a frequency division duplexing mode.

12. The apparatus of claim 11, wherein the transceiver circuit is further configured to operate in a second carrier aggregation mode to transmit and receive the one or more signals over a combination of the second predefined communication band and the third predefined communication band.

13. The apparatus of claim 11, wherein the transceiver circuit is further configured to operate in a single band mode to transmit or receive the one or more signals over any of the first predefined communication band, the second predefined communication band, or the third predefined communication band.

14. The apparatus of claim 1, wherein the plurality of filter circuits is configured to:
    filter the one or more signals while the one or more signals are transmitted or received in a frequency division duplexing mode over a combination of the first predefined communication band and the second predefined communication band; and
    filter the one or more signals while the one or more signals are transmitted or received in the frequency division duplexing mode over a combination of the second predefined communication band and the third predefined communication band.

15. The apparatus of claim 1, wherein the first predefined communication band corresponds to long term evolution (LTE) defined band 70, wherein the second predefined communication band corresponds to LTE defined band 66, and wherein the third predefined communication band corresponds to LTE defined band 25.

16. The apparatus of claim 1,
    wherein the first transmission frequency range includes frequencies between 1695 MHz and 1710 MHz,
    wherein the first reception frequency range includes frequencies between 1995 MHz and 2020 MHz,
    wherein the second transmission frequency range includes frequencies between 1710 MHz and 1780 MHz,
    wherein the second reception frequency range includes frequencies between 2110 MHz and 2200 MHz,
    wherein the third transmission frequency range includes frequencies between 1850 MHz and 1915 MHz, and
    wherein the third reception frequency range includes frequencies between 1930 MHz and 1995 MHz.

17. The apparatus of claim 1, further comprising one or more other filter circuits and a plurality of switching components, the plurality of switching components electrically connected between a node and both the plurality of filter circuits and the one or more other filter circuits.

18. The apparatus of claim 1, further comprising a diplexer electrically connected between an antenna and the plurality of filter circuits.

19. The apparatus of claim 1, wherein the plurality of filter circuits comprises one or more acoustic wave resonators.

20. A method for filtering one or more signals for wireless communications, the method comprising:
    filtering, via a quadplexer, the one or more signals transmitted and received over at least one of:
        a first predefined communication band defined by a first transmission frequency range and a first reception frequency range;
        a second predefined communication band defined by a second transmission frequency range and a second reception frequency range; and
        a third predefined communication band defined by a third transmission frequency range and a third reception frequency range, the filtering comprising:
        filtering the one or more signals using a first filter component of the quadplexer, the first filter component having a first passband that spans both the first transmission frequency range and the second transmission frequency range, the first transmission frequency range substantially adjacent to the second transmission frequency range;
        filtering the one or more signals using a second filter component of the quadplexer, the second filter component having a second passband that spans the third transmission frequency range;
        filtering the one or more signals using a third filter component of the quadplexer, the third filter component having a third passband that spans both the first reception frequency range and the third reception frequency range, the third reception frequency range substantially adjacent to the first reception frequency range; and
        filtering the one or more signals using a fourth filter component of the quadplexer, the fourth filter component having a fourth passband that spans the second reception frequency range.

21. The method of claim 20, further comprising performing carrier aggregation in a first carrier aggregation mode during a first time period to transmit and receive the one or more signals over a combination of the first predefined communication band and the second predefined communication band in a frequency division duplexing mode using the quadplexer.

22. The method of claim 21, wherein performing carrier aggregation in the first carrier aggregation mode includes simultaneously connecting a transmit path including a power amplifier to the first filter component of the quadplexer and connecting a plurality of receive paths including multiple low noise amplifiers to the third filter component and the fourth filter component of the quadplexer.

23. The method of claim 22, wherein the first predefined communication band corresponds to LTE defined band 70 while the second predefined communication band corresponds to LTE defined band 66.

24. The method of claim 21, further comprising performing carrier aggregation in a second carrier aggregation mode during a second time period to transmit and receive the one or more signals over a combination of the second predefined communication band and the third predefined communication band in a frequency divisional duplexing mode using the quadplexer.

25. The method of claim 24, wherein performing carrier aggregation in the second carrier aggregation mode includes simultaneously connecting a transmit path including a power amplifier to the second filter component of the quadplexer and connecting a plurality of receive paths including multiple low noise amplifiers to the third filter component and the fourth filter component of the quadplexer.

26. The method of claim 25, wherein the second predefined communication band corresponds to LTE defined band 66 while the third predefined communication band corresponds to LTE defined band 25.

27. An apparatus for filtering one or more signals for wireless communications, the apparatus comprising:
    means for filtering the one or more signals transmitted and received over at least one of:
        a first predefined communication band defined by a first transmission frequency range and a first reception frequency range;
        a second predefined communication band defined by a second transmission frequency range and a second reception frequency range; and
        a third predefined communication band defined by a third transmission frequency range and a third reception frequency range, the means for filtering comprising:
        a first means for filtering having a first passband that spans both the first transmission frequency range and the second transmission frequency range, the first transmission frequency range substantially adjacent to the second transmission frequency range;
        a second means for filtering having a second passband that spans the third transmission frequency range;
        a third means for filtering having a third passband that spans both the first reception frequency range and the third reception frequency range, the third reception frequency range substantially adjacent to the first reception frequency range; and
        a fourth means for filtering having a fourth passband that spans the second reception frequency range.

* * * * *